(12) United States Patent
Takano et al.

(10) Patent No.: US 12,204,003 B2
(45) Date of Patent: Jan. 21, 2025

(54) MAGNETORESISTIVE ELEMENT, MAGNETORESISTIVE DEVICE AND MAGNETIC SENSOR

(71) Applicant: TDK CORPORATION, Tokyo (JP)

(72) Inventors: Daichi Takano, Tokyo (JP); Norikazu Ota, Tokyo (JP); Hiraku Hirabayashi, Tokyo (JP); Kazuya Watanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 316 days.

(21) Appl. No.: 17/955,819

(22) Filed: Sep. 29, 2022

(65) Prior Publication Data

US 2023/0103619 A1  Apr. 6, 2023

(30) Foreign Application Priority Data

Oct. 6, 2021 (JP) .................................. 2021-164505

(51) Int. Cl.
*G01R 33/09* (2006.01)
*G01R 33/00* (2006.01)

(52) U.S. Cl.
CPC ....... *G01R 33/093* (2013.01); *G01R 33/0005* (2013.01); *G01R 33/098* (2013.01)

(58) Field of Classification Search
CPC .............. G01R 33/093; G01R 33/0005; G01R 33/098; G01R 33/0023; G01R 33/0094; G01R 33/0017
See application file for complete search history.

(56) References Cited

U.S. PATENT DOCUMENTS

| | | | |
|---|---|---|---|
| 6,075,361 A | 6/2000 | Coehoorn et al. | |
| 8,242,776 B2* | 8/2012 | Mather | G01R 33/093 324/245 |
| 2003/0214764 A1 | 11/2003 | Sapozhnikov et al. | |
| 2008/0102316 A1 | 5/2008 | Akimoto et al. | |
| 2012/0095712 A1* | 4/2012 | Komasaki | G01D 5/145 702/94 |
| 2014/0021943 A1* | 1/2014 | Watanabe | G01D 5/145 324/207.21 |

(Continued)

FOREIGN PATENT DOCUMENTS

JP  H06-244477 A  9/1994

OTHER PUBLICATIONS

Jan. 31, 2024 Office Action issued in Japanese Patent Application No. 2021-164505.

*Primary Examiner* — Alvaro E Fortich
(74) *Attorney, Agent, or Firm* — Oliff PLC

(57) ABSTRACT

An MR element includes a first magnetic layer, a second magnetic layer, and a nonmagnetic layer disposed between the first magnetic layer and the second magnetic layer. The first magnetic layer has a magnetic shape anisotropy set in a first reference direction, and has a magnetization whose direction changes depending on an external magnetic field, the magnetization being oriented in a first magnetization direction in a state where the external magnetic field is not applied. The second magnetic layer has a magnetic shape anisotropy set in a second reference direction, and has a magnetization whose direction changes depending on the external magnetic field, the magnetization being oriented in a second magnetization direction in a state where the external magnetic field is not applied.

17 Claims, 16 Drawing Sheets

(56) References Cited

U.S. PATENT DOCUMENTS

2017/0084825 A1\* 3/2017 Tsunoda ................ G11C 11/161
2017/0336229 A1\* 11/2017 Watanabe .............. G01D 5/145
2021/0063508 A1 3/2021 Hu et al.

\* cited by examiner

MAGNETORESISTIVE ELEMENT, MAGNETORESISTIVE DEVICE AND MAGNETIC SENSOR

CROSS REFERENCE TO RELATED APPLICATIONS

This application claims the benefit of Japanese Priority Patent Application No. 2021-164505 filed on Oct. 6, 2021, the entire contents of which are incorporated herein by reference.

BACKGROUND

The technology relates to a magnetoresistive element, a magnetoresistive device including the magnetoresistive element, and a magnetic sensor including the magnetoresistive element.

Magnetic sensors using magnetoresistive elements (hereinafter also referred to as MR elements) have been used for various applications in recent years. For example, an MR element is known that includes a magnetization pinned layer having a magnetization whose direction is fixed, a free layer having a magnetization whose direction is variable depending on the direction of an applied magnetic field, and a gap layer disposed between the magnetization pinned layer and the free layer.

As other examples of MR elements, MR elements with structures disclosed in U.S. Patent Application Publication No. 2021/0063508 A1 and U.S. Pat. No. 6,075,361 A are also known. U.S. Patent Application Publication No. 2021/0063508 A1 discloses a tunnel MR element including a first free layer, a second free layer, and a barrier layer disposed between the first free layer and the second free layer. In U.S. Patent Application Publication No. 2021/0063508 A1, hard bias structures for generating bias magnetic fields are provided so that a predetermined angle is formed between the magnetization of the first free layer and the magnetization of the second free layer.

U.S. Pat. No. 6,075,361 A discloses an MR element including a first ferromagnetic layer having a magnetization easy axis in a first direction, a second ferromagnetic layer having a magnetization easy axis in a second direction, and a nonmagnetic layer disposed between the first ferromagnetic layer and the second ferromagnetic layer. In U.S. Pat. No. 6,075,361 A, during the growth of the first ferromagnetic layer, a magnetic field is applied that defines the direction of the magnetization easy axis of the first ferromagnetic layer, and during the growth of the second ferromagnetic layer, a magnetic field is applied that defines the direction of the magnetization easy axis of the second ferromagnetic layer and that is in a direction different from the direction of the magnetic field applied during the growth of the first ferromagnetic layer.

In a magnetic sensor having MR elements including a magnetization pinned layer, it is necessary to set the magnetization direction of the magnetization pinned layer during the process of producing the magnetic sensor. However, an MR element including two free layers, like the MR elements disclosed in U.S. Patent Application Publication No. 2021/0063508 A1 and U.S. Pat. No. 6,075,361 A, is not provided with a magnetization pinned layer. Thus, a step of setting the magnetization direction of the magnetization pinned layer can be omitted.

In the MR element disclosed in U.S. Patent Application Publication No. 2021/0063508 A1, hard bias structures need to be provided. However, the hard bias structures prevent a reduction in the cost of the magnetic sensor. Meanwhile, in the MR element disclosed in U.S. Pat. No. 6,075,361 A, it is necessary to grow the ferromagnetic layers while applying magnetic fields in different directions. However, in a magnetic sensor configured to detect external magnetic fields in different directions, it is necessary to make the direction of a magnetic field different for each element. This results in an increased number of steps, thus posing a problem of an increased production cost for the magnetic sensor.

SUMMARY

A magnetoresistive element according to one embodiment of the technology is a magnetoresistive element having a resistance value that changes depending on an external magnetic field. The magnetoresistive element includes a first magnetic layer having a magnetic shape anisotropy set in a first reference direction and having a magnetization whose direction changes depending on the external magnetic field, the magnetization being oriented in a first magnetization direction that is one direction parallel to the first reference direction in a state where the external magnetic field is not applied; a second magnetic layer having a magnetic shape anisotropy set in a second reference direction intersecting with the first reference direction and having a magnetization whose direction changes depending on the external magnetic field, the magnetization being oriented in a second magnetization direction that is one direction parallel to the second reference direction in a state where the external magnetic field is not applied; and a nonmagnetic layer disposed between the first magnetic layer and the second magnetic layer.

In the magnetoresistive element according to one embodiment of the technology, the first reference direction and the second reference direction may be orthogonal to each other.

In the magnetoresistive element according to one embodiment of the technology, the nonmagnetic layer may be a tunnel barrier layer.

In the magnetoresistive element according to one embodiment of the technology, the first magnetic layer may include a plurality of first portions isolated from one another. The second magnetic layer may include a plurality of second portions isolated from one another. The plurality of first portions and the plurality of second portions may be arranged in a lattice pattern when seen in one direction orthogonal to each of the first reference direction and the second reference direction. Each of the plurality of first portions may have a magnetic shape anisotropy set in the first reference direction, and may have a magnetization whose direction changes depending on the external magnetic field, the magnetization being oriented in the first magnetization direction in a state where the external magnetic field is not applied. Each of the plurality of second portions may have a magnetic shape anisotropy set in the second reference direction, and may have a magnetization whose direction changes depending on the external magnetic field, the magnetization being oriented in the second magnetization direction in a state where the external magnetic field is not applied.

In the magnetoresistive element according to one embodiment of the technology, a bias magnetic field generator need not be provided that applies a bias magnetic field to each of the first magnetic layer and the second magnetic layer.

A magnetoresistive device according to one embodiment of the technology includes the magnetoresistive element according to one embodiment of the technology and a first coil configured to generate a first coil magnetic field. The first coil is configured to apply to each of the first magnetic layer and the second magnetic layer a first magnetic field component of the first coil magnetic field in a first magnetic field direction that is a direction between the first reference direction and the second reference direction.

In the magnetoresistive device according to one embodiment of the technology, the first coil may include a first coil element that generates the first coil magnetic field and extends in a direction intersecting with each of the first reference direction and the second reference direction.

The magnetoresistive device according to one embodiment of the technology may further include a second coil configured to generate a second coil magnetic field. The second coil may be configured to apply to each of the first magnetic layer and the second magnetic layer a second magnetic field component of the second coil magnetic field in a second magnetic field direction that is a direction between the first reference direction and the second reference direction, one of the first reference direction and the second reference direction being present between the first magnetic field direction and the second magnetic field direction.

In the magnetoresistive device according to one embodiment of the technology, the second coil may include a second coil element that generates the second coil magnetic field and extends in a direction intersecting with each of the first reference direction and the second reference direction.

A magnetic sensor according to one embodiment of the technology includes a plurality of magnetoresistive elements, the magnetic sensor being configured to detect a target magnetic field to be detected and generate at least one detection signal. Each of the plurality of magnetoresistive elements is the magnetoresistive element according to one embodiment of the technology.

In the magnetic sensor according to one embodiment of the technology, the plurality of magnetoresistive elements may include at least one first magnetoresistive element and at least one second magnetoresistive element connected in series with the at least one first magnetoresistive element. The first magnetization direction of the at least one first magnetoresistive element and the first magnetization direction of the at least one second magnetoresistive element may be opposite directions. The second magnetization direction of the at least one first magnetoresistive element and the second magnetization direction of the at least one second magnetoresistive element may be opposite directions. The at least one detection signal may include a first detection signal having a correspondence with a potential of a connecting point between the at least one first magnetoresistive element and the at least one second magnetoresistive element.

In the magnetic sensor according to one embodiment of the technology, the plurality of magnetoresistive elements may further include at least one third magnetoresistive element and at least one fourth magnetoresistive element connected in series with the at least one third magnetoresistive element. The first magnetization direction of the at least one third magnetoresistive element and the first magnetization direction of the at least one fourth magnetoresistive element may be opposite directions. The second magnetization direction of the at least one third magnetoresistive element and the second magnetization direction of the at least one fourth magnetoresistive element may be opposite directions. The at least one detection signal may further include a second detection signal having a correspondence with a potential of a connecting point between the at least one third magnetoresistive element and the at least one fourth magnetoresistive element.

The magnetic sensor according to one embodiment of the technology may further include a first coil configured to generate a first coil magnetic field, and a second coil configured to generate a second coil magnetic field. The first coil may be configured to apply to the at least one first magnetoresistive element a first magnetic field component of the first coil magnetic field in a first magnetic field direction that is a direction between the first magnetization direction and the second magnetization direction of the at least one first magnetoresistive element, and may also be configured to apply to the at least one second magnetoresistive element a second magnetic field component of the first coil magnetic field in a second magnetic field direction opposite to the first magnetic field direction. The second coil may be configured to apply to the at least one third magnetoresistive element a third magnetic field component of the second coil magnetic field in a third magnetic field direction that is a direction between the first magnetization direction and the second magnetization direction of the at least one third magnetoresistive element, and may also be configured to apply to the at least one fourth magnetoresistive element a fourth magnetic field component of the second coil magnetic field in a fourth magnetic field direction opposite to the third magnetic field direction.

The magnetic sensor according to one embodiment of the technology may further include a processor configured to generate a detection value having a correspondence with the target magnetic field to be detected based on the first detection signal generated after temporarily generating the first coil magnetic field and a second detection signal generated after temporarily generating the second coil magnetic field.

In the magnetic sensor according to one embodiment of the technology, the plurality of magnetoresistive elements may be arranged in a lattice pattern when seen in one direction orthogonal to each of the first reference direction and the second reference direction.

The magnetoresistive element according to one embodiment of the technology includes a first magnetic layer, a second magnetic layer, and a nonmagnetic layer. In other words, the magnetoresistive element according to one embodiment of the technology includes no magnetization pinned layer. Thereby according to one embodiment of the technology, a magnetoresistive element with a reduced cost can be achieved. The magnetoresistive device according to one embodiment of the technology includes the magnetoresistive element according to one embodiment of the technology. Thereby according to one embodiment of the technology, a magnetoresistive device with a reduced cost can be achieved. The magnetic sensor according to one embodiment of the technology includes the plurality of magnetoresistive elements according to one embodiment of the technology. Thereby according to one embodiment of the technology, a magnetic sensor with a reduced cost can be achieved.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
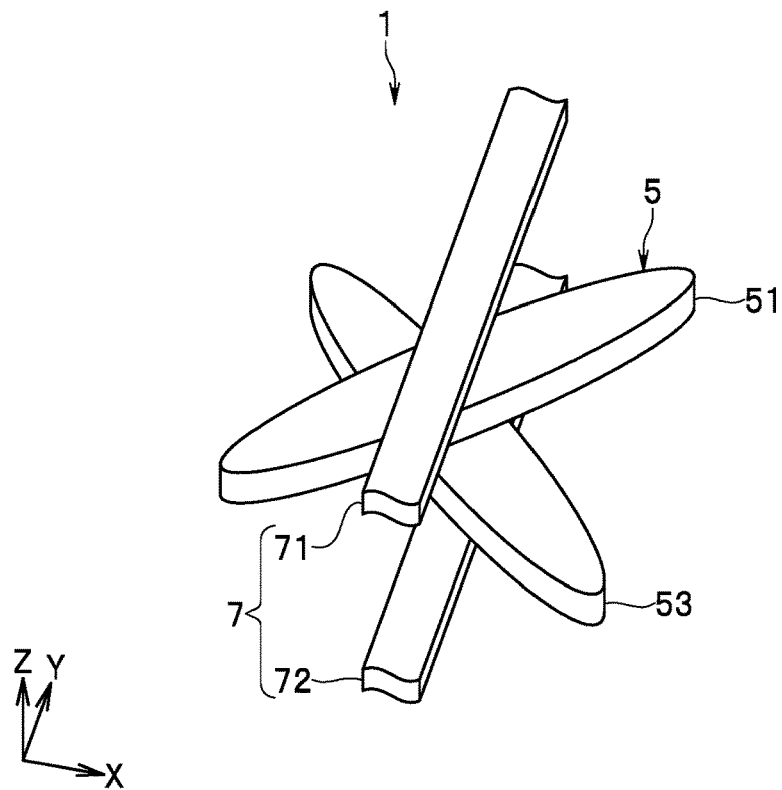
FIG. 1 is a perspective view showing a main part of a magnetoresistive device according to a first example embodiment of the technology.

An object of the technology is to provide a magnetoresistive element with a reduced cost that includes two magnetic layers each having a magnetization whose direction changes depending on an external magnetic field, and also provide a magnetoresistive device and a magnetic sensor each including the magnetoresistive element.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
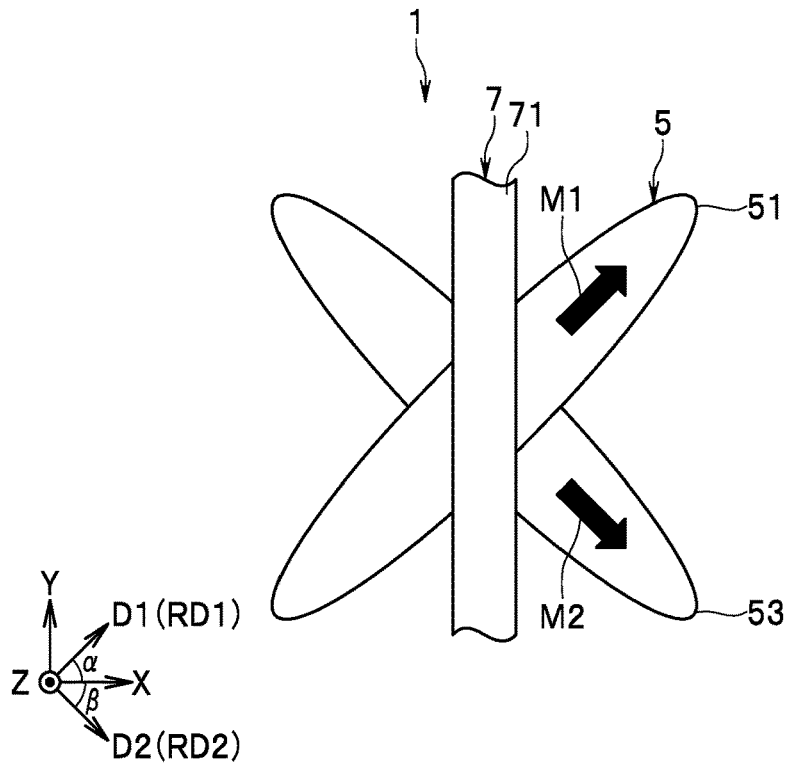
FIG. 2 is a plan view showing the main part of the magnetoresistive device according to the first example embodiment of the technology.
Figure 3:
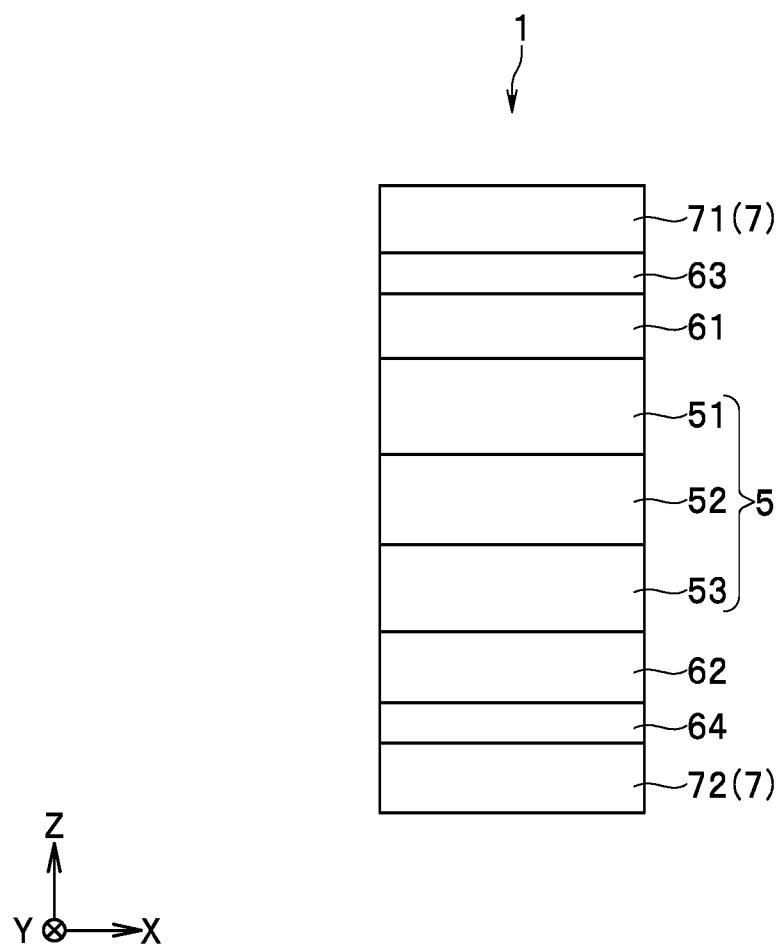
FIG. 3 is a sectional view showing a part of the magnetoresistive device according to the first example embodiment of the technology.

Example embodiments of the technology will now be described in detail with reference to the drawings. First, a configuration of a magnetoresistive element according to a first example embodiment of the technology, and a configuration of a magnetoresistive device according to the first example embodiment of the technology will be described. FIG. 1 is a perspective view showing a main part of the magnetoresistive device according to the present example embodiment. FIG. 2 is a plan view showing the main part of the magnetoresistive device according to the present example embodiment. FIG. 3 is a cross-sectional view showing a cross section of the magnetoresistive device according to the present example embodiment.

As shown in FIGS. 1 to 3, a magnetoresistive device 1 according to the present example embodiment includes a magnetoresistive element (hereinafter referred to as an MR element) 5 according to the present example embodiment. The MR element 5 has a resistance value that changes depending on an external magnetic field. The MR element 5 includes a first magnetic layer 51, a second magnetic layer 53, and a nonmagnetic layer 52 disposed between the first magnetic layer 51 and the second magnetic layer 53.

Herein, an X direction, a Y direction, and a Z direction are defined as follows. The X direction, the Y direction, and the Z direction are orthogonal to each other. In the present example embodiment, one direction that is parallel to the stacked direction of the first magnetic layer 51, the nonmagnetic layer 52, and the second magnetic layer 53 and is directed from the second magnetic layer 53 to the first magnetic layer 51 is referred to as the Z direction. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above". A surface located at an end of each component of the magnetoresistive device 1 and the MR element 5 in the Z direction is referred to as a "top surface," and a surface located at an end in the −Z direction is referred to as a "bottom surface."

A first reference direction RD1 and a second reference direction RD2 are defined as follows. Each of the first reference direction RD1 and the second reference direction RD2 is defined as including one specific direction and a direction opposite to the specific direction. The first reference direction RD1 and the second reference direction RD2 intersect with each other. The first reference direction RD1 is a direction parallel to a direction rotated from the X direction to the Y direction by $\alpha$. The second reference direction RD2 is a direction parallel to a direction rotated from the X direction to the −Y direction by $\beta$. Note that each of $\alpha$ and $\beta$ is an angle larger than 0° and smaller than 90°. $\alpha$ and $\beta$ may be equal to each other or different from each other. For example, each of $\alpha$ and $\beta$ is 45°. In such a case, the first reference direction RD1 and the second reference direction RD2 are orthogonal to each other.

As shown in FIGS. 1 and 2, the first magnetic layer 51 has a magnetic shape anisotropy set in the first reference direction RD1. In other words, the first magnetic layer 51 is long in the first reference direction RD1 when seen from above. The first magnetic layer 51 also has a magnetization M1 whose direction changes depending on an external magnetic field. The magnetization M1 is oriented in a first magnetization direction that is one direction parallel to the first reference direction RD1 in a state where no external magnetic field is applied.

As shown in FIGS. 1 and 2, the second magnetic layer 53 has a magnetic shape anisotropy set in the second reference direction RD2. In other words, the second magnetic layer 53 is long in the second reference direction RD2 when seen from above. The second magnetic layer 53 also has a magnetization M2 whose direction changes depending on an external magnetic field. The magnetization M2 is oriented in a second magnetization direction that is one direction parallel to the second reference direction RD2 in a state where no external magnetic field is applied.

Hereinafter, the direction of the magnetization M1 in a state where no external magnetic field is applied, which is a prescribed direction of the magnetization M1, will be referred to as the direction of the magnetization M1 in the initial state or will be simply referred to as the direction in the initial state. Similarly, the direction of the magnetization M2 in a state where no external magnetic field is applied, which is a prescribed direction of the magnetization M2, will be referred to as the direction of the magnetization M2 in the initial state or will be simply referred to as the direction in the initial state.

In the example shown in FIG. 2, the MR element 5 is configured to detect a magnetic field component in a direction parallel to the X direction of an external magnetic field. In this example, the magnetization M1 of the first magnetic layer 51 in the initial state is oriented in a direction D1 that is one direction parallel to the first reference direction RD1 and is rotated from the X direction to the Y direction by $\alpha$. In other words, in this example, the first magnetization direction is the direction D1. In this example, the magnetization M2 of the second magnetic layer 53 in the initial state is oriented in a direction D2 that is one direction parallel to the second reference direction RD2 and is rotated from the X direction to the −Y direction by $\beta$. In other words, in this example, the second magnetization direction is the direction D2.

In the example shown in FIGS. 1 and 2, the planar shape (the shape seen from above) of each of the first and second magnetic layers 51 and 53 is an elliptical shape. Note that the planar shape of each of the first and second magnetic layers 51 and 53 is not limited to a shape including no constant width portion where the width in the short-side direction is constant, like the elliptical shape, and may be a shape including a constant width portion. Examples of a planar shape including a constant width portion include a rectangular shape in which both ends in the longitudinal direction are straight, an oval shape in which both ends in the longitudinal direction are semicircular, and a polygonal shape in which both ends in the longitudinal direction are polygonal.

The magnetoresistive device 1 further includes an upper electrode 61 and a lower electrode 62. The upper electrode 61 is disposed above the lower electrode 62. The upper electrode 61 and the lower electrode 62 are adapted to flow a current for detecting a magnetic signal through the MR element 5. The MR element 5 is disposed between the upper electrode 61 and the lower electrode 62. The first magnetic layer 51 is connected to the upper electrode 61. The second magnetic layer 53 is connected to the lower electrode 62.

The MR element 5 is a CPP (current perpendicular to plane) MR element in which a current for detecting a magnetic signal is flowed in a direction substantially perpendicular to the surface of each layer forming the MR element 5. The nonmagnetic layer 52 may be a tunnel barrier layer or a nonmagnetic conductive layer. In particular, in the present example embodiment, the nonmagnetic layer 52 is a tunnel barrier layer.

The resistance value of the MR element 5 changes depending on the angle formed by the direction of the magnetization M1 of the first magnetic layer 51 and the direction of the magnetization M2 of the second magnetic layer 53. The resistance value becomes higher as the angle is larger.

The magnetoresistive device 1 further includes a first coil 7 configured to generate a first coil magnetic field. As shown in FIGS. 1 to 3, the first coil 7 includes coil elements 71 and 72, each of which generates the first coil magnetic field. Note that the coil elements are parts of a conductive wire forming the coil. Each of the coil elements 71 and 72 extends in a direction intersecting with each of the first reference direction RD1 and the second reference direction RD2. In particular, in the present example embodiment, each of the coil elements 71 and 72 extends in a direction parallel to the Y direction. The coil element 71 is disposed above the MR element 5 and the upper electrode 61. The coil element 72 is disposed below the MR element 5 and the lower electrode 62. The coil elements 71 and 72 are connected in series or parallel.

The first coil 7 is configured to apply to each of the first magnetic layer 51 and the second magnetic layer 53 a magnetic field component in a first magnetic field direction of the first coil magnetic field. The first magnetic field direction is a direction between the first reference direction RD1 and the second reference direction RD2. In the present example embodiment, the coil elements 71 and 72 are configured to apply to each of the first magnetic layer 51 and the second magnetic layer 53 a magnetic field component in the X direction or the −X direction. In other words, in the present example embodiment, the first magnetic field direction is the X direction or the −X direction.

The first coil 7 is controlled by a not-shown coil drive circuit. The coil drive circuit controls the first coil 7 so that the first coil magnetic field is temporarily generated. Note that the coil drive circuit may be included in a processor described below, or may be a circuit that is at least partially independent of the processor.

The magnetoresistive device 1 further includes an insulating layer 63 interposed between the coil element 71 and the upper electrode 61, an insulating layer 64 interposed between the coil element 72 and the lower electrode 62, and a not-shown insulating layer disposed around the MR element 5 and the first coil 7.

Note that in the present example embodiment, a bias magnetic field generator (for example, a magnet) is not provided that applies a bias magnetic field to each of the first magnetic layer 51 and the second magnetic layer 53.

Figure 4:
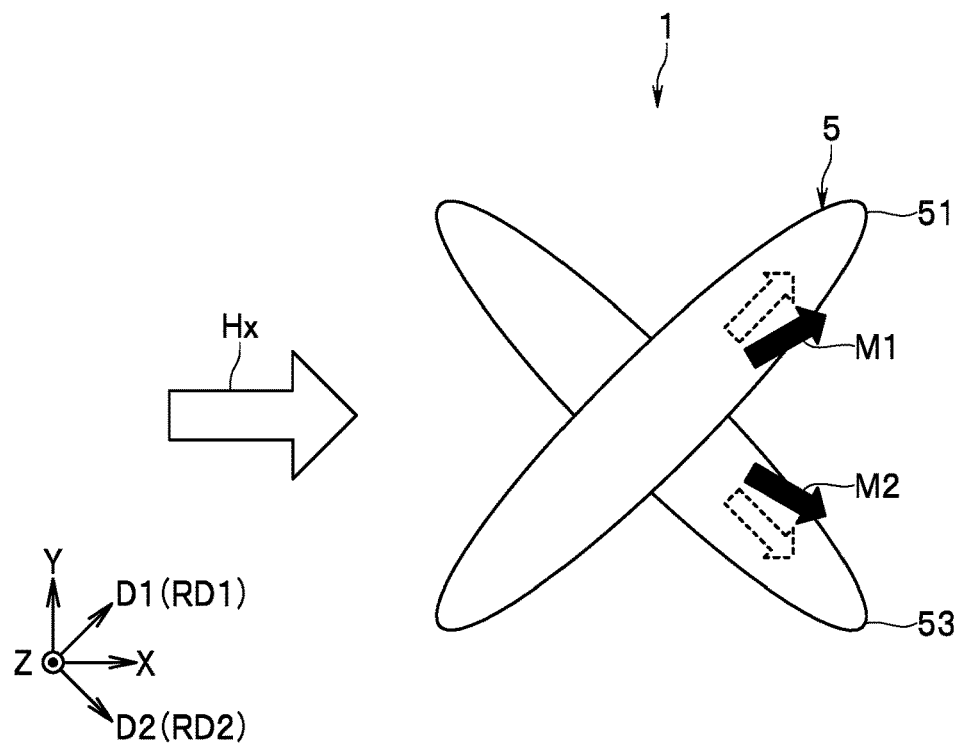
FIG. 4 is an explanatory view for illustrating an operation of a magnetoresistive element according to the first example embodiment of the technology.
Figure 5:
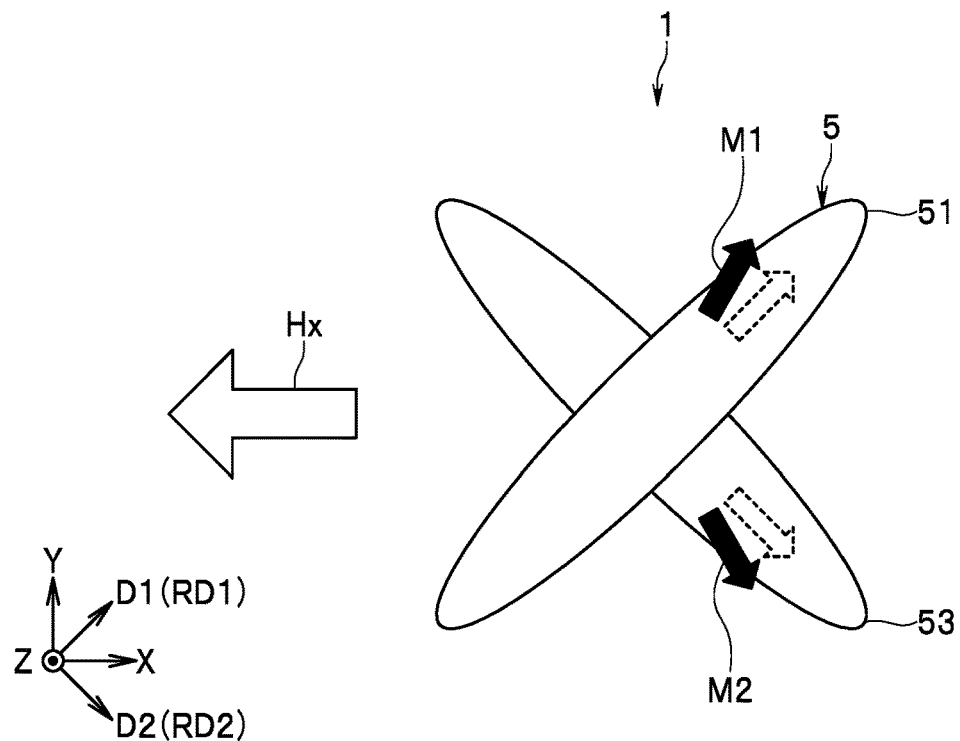
FIG. 5 is an explanatory view for illustrating the operation of the magnetoresistive element of the first example embodiment of the technology.

Next, an operation of the MR element 5 will be described with reference to FIGS. 4 and 5. FIGS. 4 and 5 are explanatory views for illustrating the operation of the MR element 5. Hereinafter, description will be made of an example in which the MR element 5 is configured to detect a magnetic field component in the direction parallel to the X direction of an external magnetic field as in the example shown in FIG. 2. In FIGS. 4 and 5, a dashed arrow drawn in the first magnetic layer 51 represents the direction of the magnetization M1 in the initial state, and a dashed arrow drawn in the second magnetic layer 53 represents the direction of the magnetization M2 in the initial state.

FIG. 4 shows a case where a magnetic field component Hx in the direction parallel to the X direction of an external magnetic field is applied to the MR element 5, and the direction of the magnetic field component Hx is the X direction. In such a case, the magnetization M1 is inclined in the X direction from the direction D1, and the magnetization M2 is inclined in the X direction from the direction D2. Consequently, the angle formed by the direction of the magnetization M1 and the direction of the magnetization M2 becomes smaller than the angle in the initial state, and thus, the resistance value of the MR element 5 becomes lower than the resistance value in the initial state.

FIG. 5 shows a case where the magnetic field component Hx is applied to the MR element 5, and the direction of the magnetic field component Hx is the –X direction. In such a case, the magnetization M1 is inclined in the Y direction from the direction D1, and the magnetization M2 is inclined in the –Y direction from the direction D2. Consequently, the angle formed by the direction of the magnetization M1 and the direction of the magnetization M2 becomes larger than the angle in the initial state, and thus, the resistance value of the MR element 5 becomes higher than the resistance value in the initial state.

The angle formed by the direction of the magnetization M1 and the direction of the magnetization M2 changes depending on the direction and strength of the magnetic field component Hx. The resistance value of the MR element 5 changes depending on the foregoing angle. Thus, detecting the resistance value of the MR element 5 can detect the direction and strength of the magnetic field component Hx.

Next, an operation of the first coil 7 will be described. When the magnetoresistive device 1 is in use, there may be a case where a large magnetic field is applied to the MR element 5 that rotates the direction of each of the magnetizations M1 and M2 to a side opposite to the direction in the initial state. In such a case, even if such a large magnetic field disappears, there may be a case where the state in which the direction of each of the magnetizations M1 and M2 is opposite to the direction in the initial state is maintained. In the present example embodiment, the first coil 7 and the first coil magnetic field are used to, in a case where the direction of each of the magnetizations M1 and M2 has become different from the direction in the initial state in a state where no external magnetic field is applied, set the direction of each of the magnetizations M1 and M2 to the direction in the initial state, that is, to reset the direction of each of the magnetizations M1 and M2.

Figure 6:
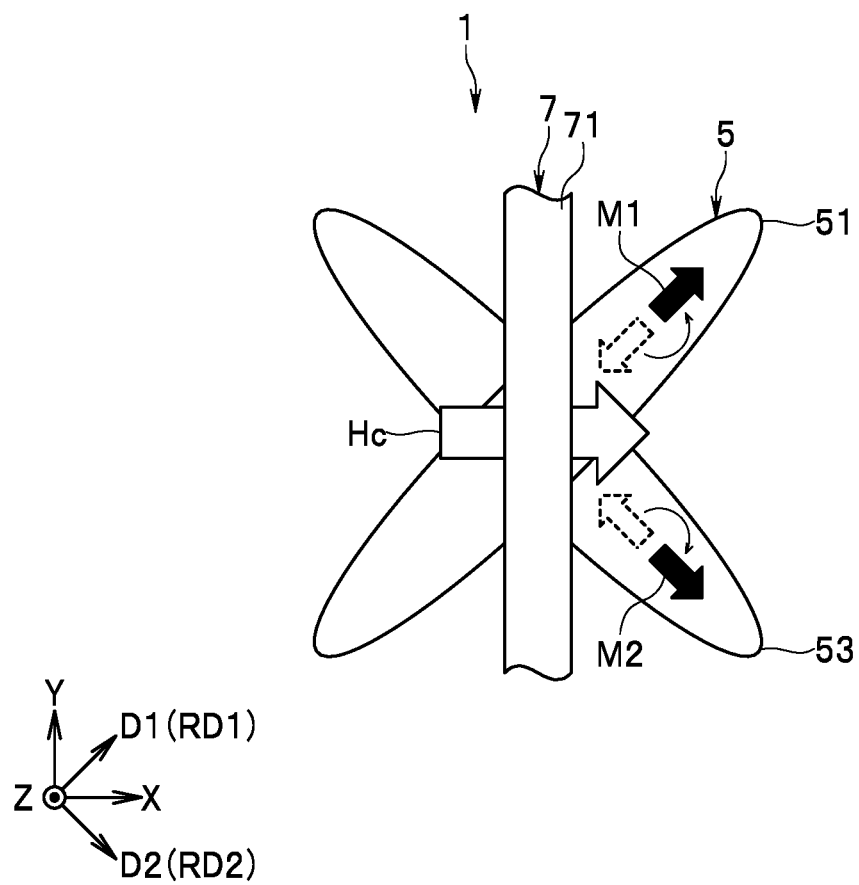
FIG. 6 is an explanatory view for illustrating an operation of a first coil of the first example embodiment of the technology.

FIG. 6 is an explanatory view for illustrating the operation of the first coil 7. In FIG. 6, a dashed arrow drawn in the first magnetic layer 51 represents the direction of the magnetization M1 that has become opposite to the direction of the magnetization M1 in the initial state in a state where no external magnetic field is applied. A dashed arrow drawn in the second magnetic layer 53 represents the direction of the magnetization M2 that has become opposite to the direction of the magnetization M2 in the initial state in a state where no external magnetic field is applied.

In the example shown in FIG. 6, when a current for generating the first coil magnetic field is supplied to the first coil 7, each of the coil elements 71 and 72 generates the first coil magnetic field. The first coil 7 is controlled to apply to each of the first magnetic layer 51 and the second magnetic layer 53 a magnetic field component Hc in the X direction of the first coil magnetic field. Specifically, the direction of a current flowed through each of the coil elements 71 and 72 is controlled so that the magnetic field component Hc in the X direction is generated. Thereby the direction of each of the magnetizations M1 and M2 rotates in the X direction. After that, when the supply of a current to the first coil 7 is stopped, the direction of each of the magnetizations M1 and M2 becomes the direction in the initial state.

Note that in a case where the direction of the magnetization M1 of the first magnetic layer 51 in the initial state is opposite to the direction D1, and the direction of the magnetization M2 of the second magnetic layer 53 in the initial state is opposite to the direction D2, the first coil 7 is controlled to apply to each of the first magnetic layer 51 and the second magnetic layer 53 the magnetic field component Hc in the –X direction. Specifically, the direction of a current flowed through each of the coil elements 71 and 72 is set opposite to the direction shown in FIG. 6.

As described above, the MR element 5 according to the present example embodiment includes the first and second magnetic layers 51 and 53 each having a magnetic shape anisotropy set on the layer. Thereby according to the present example embodiment, it is possible to use the MR element 5 as a magnetic detection element without using a magnetization pinned layer having a magnetization whose direction is fixed or using a bias magnetic field generator. Thereby according to the present example embodiment, a cost reduction is possible. Further, using the MR element 5 according to the present example embodiment can reduce the cost of the magnetoresistive device 1.

Second Example Embodiment

Figure 7:
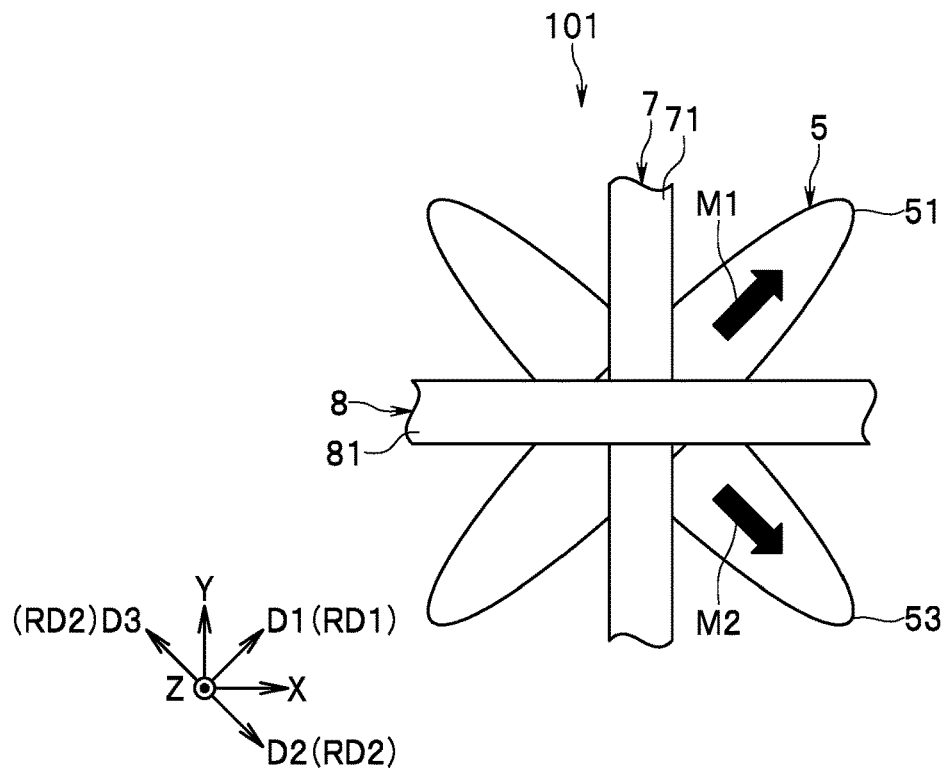
FIG. 7 is a plan view showing a main part of a magnetoresistive device according to a second example embodiment of the technology.
Figure 8:
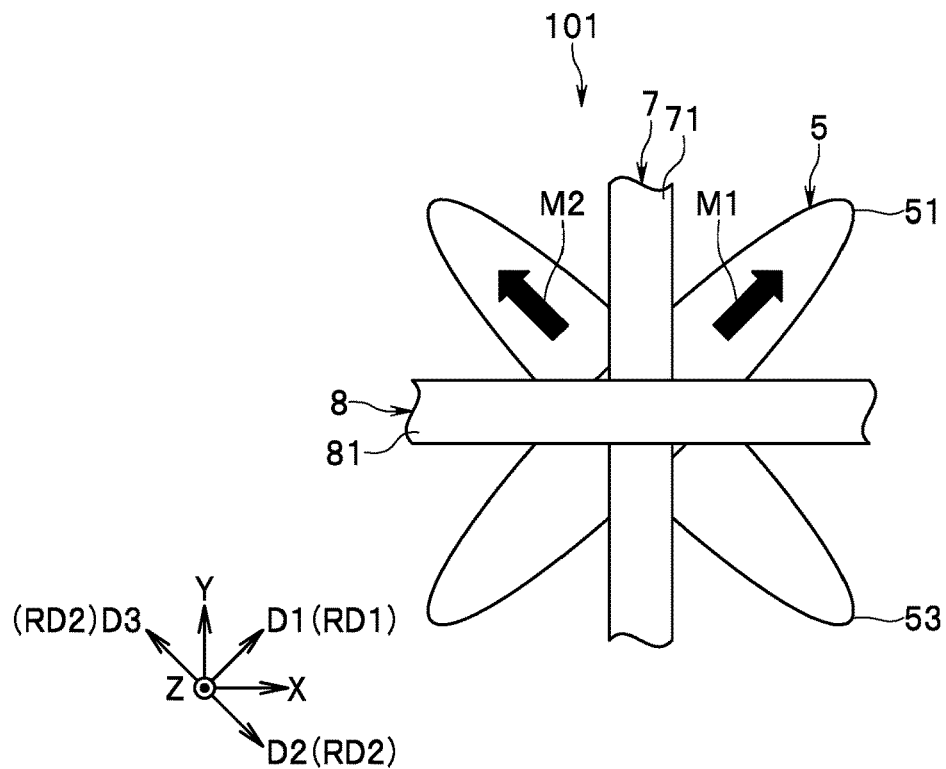
FIG. 8 is a plan view showing the main part of the magnetoresistive device according to the second example embodiment of the technology.

A second example embodiment of the technology will now be described. First, a magnetoresistive device according to the present example embodiment will be described with reference to FIGS. 7 and 8. FIGS. 7 and 8 are explanatory views each showing the main part of the magnetoresistive device according to the present example embodiment.

A magnetoresistive device 101 according to the present example embodiment includes a second coil 8 configured to generate a second coil magnetic field in addition to the components of the magnetoresistive device 1 according to the first example embodiment, that is, the MR element 5 and the first coil 7. As shown in FIGS. 7 and 8, the second coil 8 includes a coil element 81 and a not-shown coil element, each of which generates the second coil magnetic field. Each of the coil element 81 and the not-shown coil element extends in a direction intersecting with each of the first reference direction RD1 and the second reference direction RD2. In particular, in the present example embodiment, each of the coil element 81 and the not-shown coil element extends in the direction parallel to the X direction.

The coil element 81 is disposed above the MR element 5 and the upper electrode 61 (see FIG. 3). The coil element 81 may be disposed above the coil element 71 of the first coil 7, or may be disposed below the coil element 71. The not-shown coil element is disposed below the MR element 5 and the lower electrode 62 (see FIG. 3). The not-shown coil element may be disposed above the coil element 72 of the first coil 7 (see FIG. 3), or may be disposed below the coil element 72. The coil element 81 and the not-shown coil element are connected in series or parallel.

The second coil 8 is configured to apply to each of the first magnetic layer 51 and the second magnetic layer 53 of the MR element 5 a magnetic field component in a second magnetic field direction of the second coil magnetic field. The second magnetic field direction is a direction between the first reference direction RD1 and the second reference direction RD2. One of the first reference direction RD1 and the second reference direction RD2 is present between the direction of the magnetic field component of the first coil magnetic field, that is, the first magnetic field direction and the second magnetic field direction.

In the present example embodiment, the coil element 81 and the not-shown coil element are configured to apply to each of the first magnetic layer 51 and the second magnetic layer 53 a magnetic field component in the Y direction or the −Y direction. In other words, according to the present example embodiment, the second magnetic field direction is the Y direction or the −Y direction. One of the first reference direction RD1 and the second reference direction RD2 is present between the first magnetic field direction (the X direction or the −X direction) and the second magnetic field direction (the Y direction or the −Y direction).

The second coil 8 is controlled by a not-shown coil drive circuit as with the first coil 7. The coil drive circuit controls the second coil 8 so that the second coil magnetic field is temporarily generated.

Next, an operation of each of the first and second coils 7 and 8 of the present example embodiment will be described. In the present example embodiment, the first coil 7 and the first coil magnetic field are used to set the direction of the magnetization M1 of the first magnetic layer 51 of the MR element 5 to the direction D1 or a direction opposite to the direction D1, and set the direction of the magnetization M2 of the second magnetic layer 53 of the MR element 5 to the direction D2 or a direction opposite to the direction D2. FIG. 7 shows an example in which the direction of the magnetization M1 is set to the direction D1, and the direction of the magnetization M2 is set to the direction D2. In this example, the first coil 7 is controlled to apply to each of the first magnetic layer 51 and the second magnetic layer 53 a magnetic field component in the X direction of the first coil magnetic field as in the example shown in FIG. 6 of the first example embodiment.

In the present example embodiment, the second coil 8 and the second coil magnetic field are used to set the direction of the magnetization M1 of the first magnetic layer 51 of the MR element 5 to the direction D1 or a direction opposite to the direction D1, and set the direction of the magnetization M2 of the second magnetic layer 53 of the MR element 5 to a direction D3 or a direction opposite to the direction D3. The direction D3 is one direction parallel to the second reference direction RD2 and is a direction rotated from the Y direction to the −X direction, and is also a direction opposite to the direction D2.

FIG. 8 shows an example in which the direction of the magnetization M1 is set to the direction D1, and the direction of the magnetization M2 is set to the direction D3. In this example, the second coil 8 is controlled to apply to each of the first magnetic layer 51 and the second magnetic layer 53 a magnetic field component in the Y direction of the second coil magnetic field. Specifically, the direction of a current flowed through each of the coil element 81 and the not-shown coil element is controlled so that a magnetic field component in the Y direction is generated. Thereby the direction of each of the magnetizations M1 and M2 rotates in the Y direction. After that, when the supply of a current to the second coil 8 is stopped, the magnetizations M1 and M2 are respectively oriented in the directions D1 and D3.

Note that in a case where the direction of the magnetization M1 is set to a direction opposite to the direction D1, and the direction of the magnetization M2 is set to a direction opposite to the direction D3, the second coil 8 is controlled to apply to each of the first and second magnetic layers 51 and 53 a magnetic field component in the −Y direction of the second coil magnetic field. Specifically, the direction of a current flowed through each of the coil element 81 and the not-shown coil element is set to a direction opposite to the direction shown in FIG. 8.

Next, an operation of the MR element 5 according to the present example embodiment will be described. The operation of the MR element 5 in a case where the direction of the magnetization M1 is set to the direction D1 and the direction of the magnetization M2 is set to the direction D2 is the same as the operation of the MR element 5 of the first example embodiment described with reference to FIGS. 4 and 5.

Hereinafter, the operation of the MR element 5 in a case where the direction of the magnetization M1 is set to the direction D1 and the direction of the magnetization M2 is set to the direction D3 will be described. In such a case, when a magnetic field component in the Y direction of an external magnetic field is applied to the MR element 5, the magnetization M1 is inclined in the Y direction from the direction D1, and the magnetization M2 is inclined in the Y direction from the direction D3. Consequently, the angle formed by the direction of the magnetization M1 and the direction of the magnetization M2 becomes smaller than the angle in the initial state, and thus, the resistance value of the MR element 5 becomes lower than the resistance value in the initial state.

When a magnetic field component in the −Y direction of an external magnetic field is applied to the MR element 5, the magnetization M1 is inclined in the −Y direction from the direction D1, and the magnetization M2 is inclined in the −Y direction from the direction D3. Consequently, the angle formed by the direction of the magnetization M1 and the direction of the magnetization M2 becomes larger than the angle in the initial state, and thus, the resistance value of the MR element 5 becomes higher than the resistance value in the initial state.

The angle formed by the direction of the magnetization M1 and the direction of the magnetization M2 changes depending on the direction and strength of a magnetic field component in the direction parallel to the Y direction of an external magnetic field. The resistance value of the MR element 5 changes depending on the foregoing angle. Thus, detecting the resistance value of the MR element 5 can detect the direction and strength of a magnetic field component in the direction parallel to the Y direction of an external magnetic field.

As described above, according to the magnetoresistive device 101 according to the present example embodiment, one MR element 5 can detect a magnetic field component in the direction parallel to the X direction of an external magnetic field, and a magnetic field component in the direction parallel to the Y direction of an external magnetic field.

The configuration, operation and effects of the present example embodiment are otherwise the same as those of the first example embodiment.

Third Example Embodiment

Figure 9:
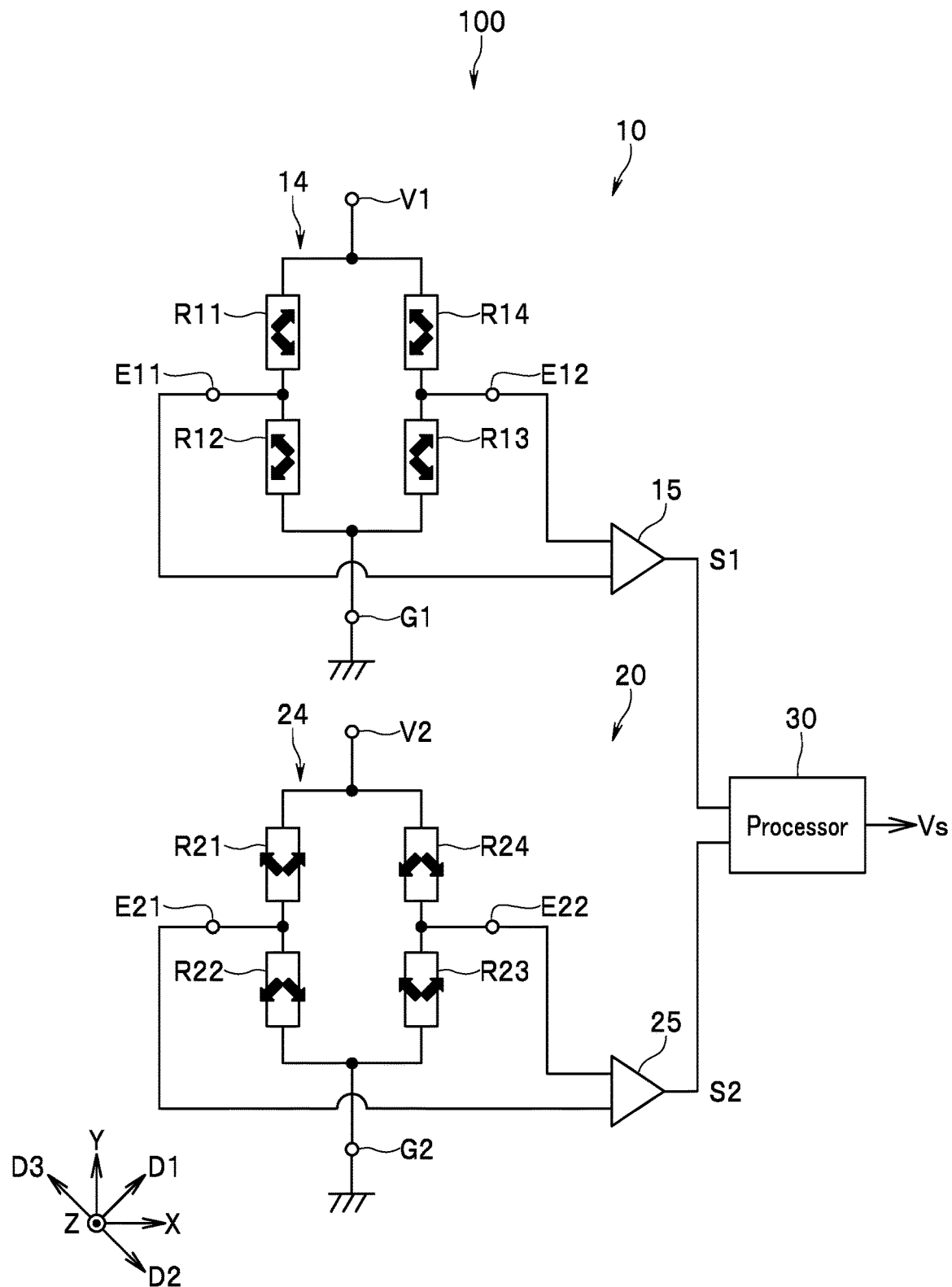
FIG. 9 is a circuit diagram showing a configuration of a magnetic sensor according to a third example embodiment of the technology.
Figure 10:
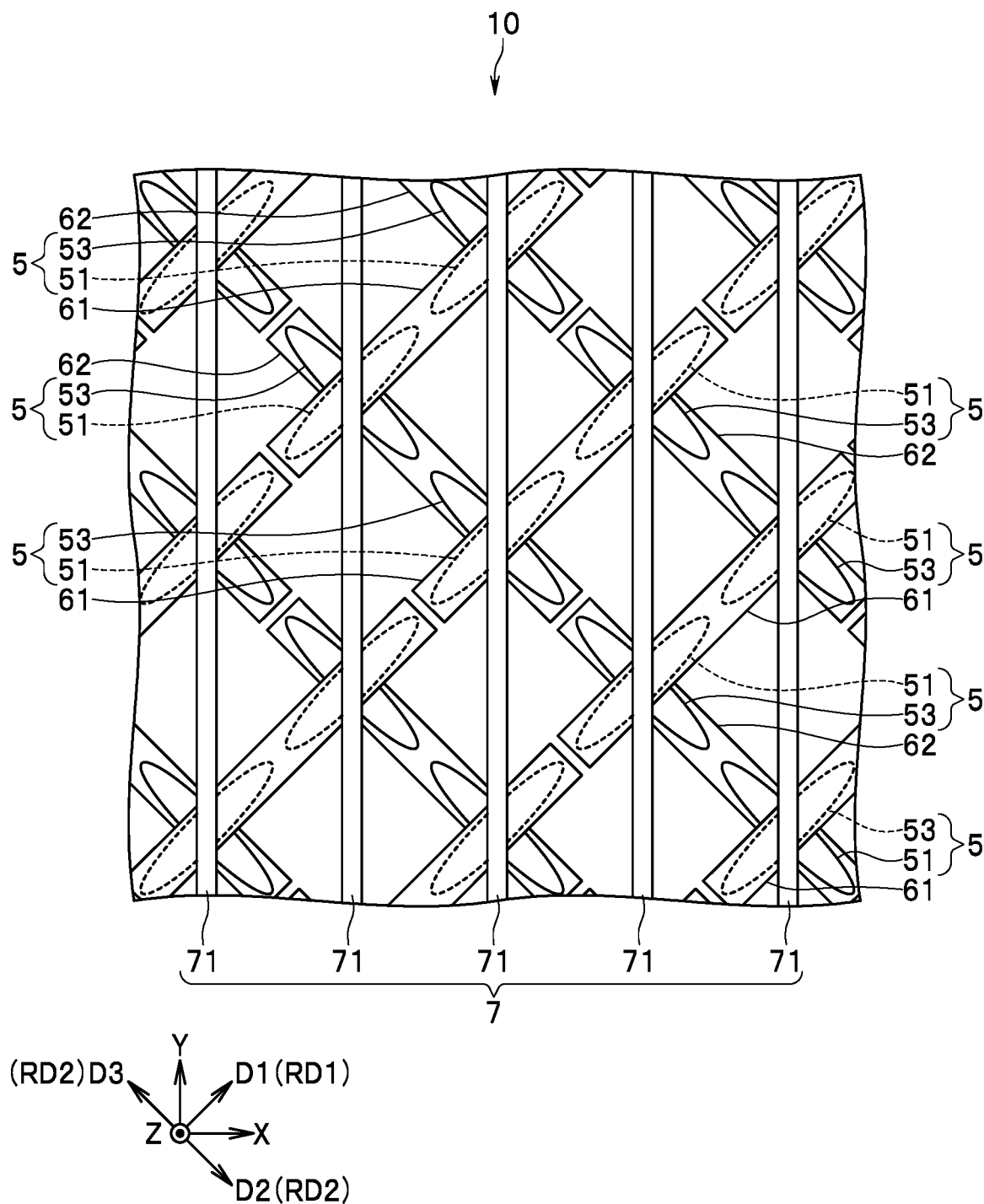
FIG. 10 is a plan view showing a part of a first detection circuit of the magnetic sensor according to the third example embodiment of the technology.
Figure 11:
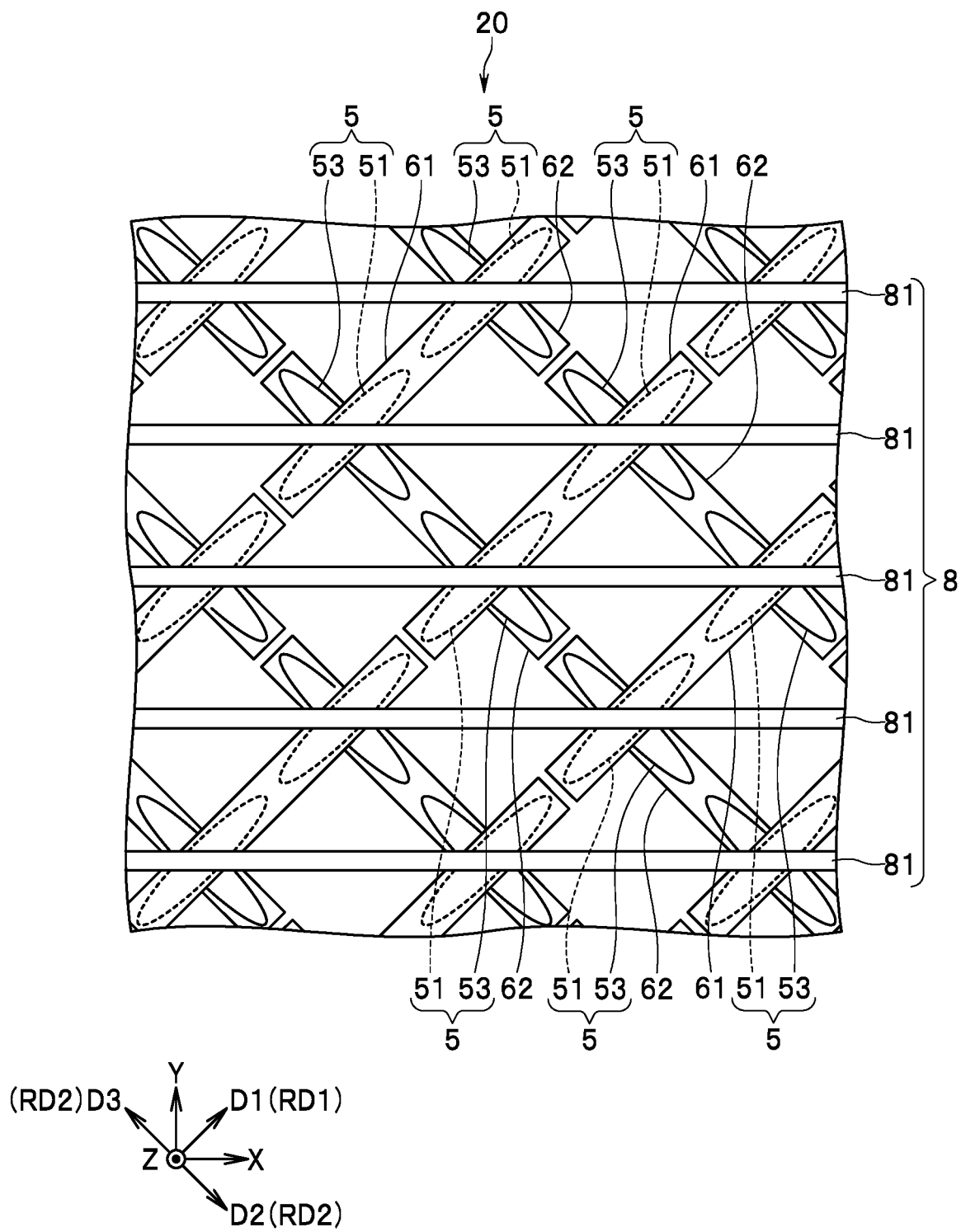
FIG. 11 is a plan view showing a part of a second detection circuit of the magnetic sensor according to the third example embodiment of the technology.

A third example embodiment of the technology will now be described. First, a configuration of a magnetic sensor according to the present example embodiment will be described with reference to FIGS. 9 to 11. FIG. 9 is a circuit diagram showing the configuration of the magnetic sensor according to the present example embodiment. FIG. 10 is a plan view showing a part of a first detection circuit of the magnetic sensor according to the present example embodiment. FIG. 11 is a plan view showing a part of a second detection circuit of the magnetic sensor according to the present example embodiment.

The magnetic sensor 100 includes a plurality of MR elements. Each of the plurality of MR elements is the MR element 5 described in the first example embodiment. The configuration of the MR element 5 in the magnetic sensor 100 is the same as the configuration of the MR element 5 shown in FIGS. 1 to 3.

The magnetic sensor 100 is configured to detect a target magnetic field that is a target magnetic field to be detected, and generate at least one detection signal. In particular, in the present example embodiment, the magnetic sensor 100 includes a first detection circuit 10 configured to detect a component in the direction parallel to the X direction of the target magnetic field and generate a first detection signal S1, and a second detection circuit 20 configured to detect a component in the direction parallel to the Y direction of the target magnetic field and generate a second detection signal S2.

The first detection circuit 10 includes a Wheatstone bridge circuit 14 and a difference detector 15. The Wheatstone bridge circuit 14 includes four resistor sections R11, R12, R13 and R14, a power supply port V1, a ground port G1, and two output ports E11 and E12. The resistor section R11 is provided between the power supply port V1 and the output port E11. The resistor section R12 is provided between the output port E11 and the ground port G1. The resistor section R13 is provided between the output port E12 and the ground port G1. The resistor section R14 is provided between the power supply port V1 and the output port E12. A voltage or current of a predetermined magnitude is applied to the power supply port V1. The ground port G1 is connected to the ground. The difference detector 15 outputs a signal corresponding to the potential difference between the output ports E11 and E12 as the first detection signal S1.

The circuit configuration of the second detection circuit 20 is similar to the circuit configuration of the first detection circuit 10. In other words, the second detection circuit 20 includes a Wheatstone bridge circuit 24 and a difference detector 25. The Wheatstone bridge circuit 24 includes four resistor section R21, R22, R23 and R24, a power supply port V2, a ground port G2, and two output ports E21 and E22. The resistor section R21 is provided between the power supply port V2 and the output port E21. The resistor section R22 is provided between the output port E21 and the ground port G2. The resistor section R23 is provided between the output port E22 and the ground port G2. The resistor section R24 is provided between the power supply port V2 and the output port E22. A voltage or current of a predetermined magnitude is applied to the power supply port V2. The ground port G2 is connected to the ground. The difference detector 25 outputs a signal corresponding to the potential difference between the output ports E21 and E22 as the second detection signal S2.

The magnetic sensor 100 further includes a processor 30 configured to generate a detection value Vs having a correspondence with the target magnetic field based on the first and second detection signals S1 and S2. In a case where the direction of a component parallel to a reference plane of the target magnetic field rotates about a reference position in the reference plane, the detection value Vs may have a correspondence with the angle that the direction of the foregoing component of the target magnetic field at the reference position forms with respect to the reference direction. The reference position may be a position where the magnetic sensor 100 is disposed. The reference plane may be a plane parallel to the X direction and the Y direction (the XY plane). The reference direction may be the X direction. The processor 30 may be constructed of an application-specific integrated circuit (ASIC) or a microcomputer.

Each of the resistor sections R11 to R14 and R21 to R24 includes at least one MR element 5. The at least one MR element 5 of the resistor section R12 is connected in series with the at least one MR element 5 of the resistor section R11. The at least one MR element 5 of the resistor section R14 is connected in series with the at least one MR element 5 of the resistor section R13. The at least one MR element 5 of the resistor section R22 is connected in series with the at least one MR element 5 of the resistor section R21. The at least one MR element 5 of the resistor section R24 is connected in series with the at least one MR element 5 of the resistor section R23.

In particular, in the present example embodiment, each of the resistor sections R11 to R14 and R21 to R24 includes a plurality of MR elements 5. FIG. 10 shows a part of one of the resistor sections R11 to R14. FIG. 11 shows a part of one of the resistor sections R21 to R24. FIGS. 10 and 11 each show the X direction, the Y direction, the Z direction, the first reference direction RD1, and the second reference direction RD2 shown in FIG. 2. The plurality of MR elements 5 are arranged in a lattice pattern when seen from above. In other words, the plurality of MR elements 5 are arranged such that two or more MR elements 5 are arranged in each of the first reference direction RD1 and the second reference direction RD2.

Each of the resistor sections R11 to R14 and R21 to R24 further includes a plurality of upper electrodes 61 and a plurality of lower electrodes 62. Each individual lower electrode 62 is long in the second reference direction RD2. A gap is formed between two lower electrodes 62 adjoining in the longitudinal direction of the lower electrodes 62. As shown in FIGS. 10 and 11, the second magnetic layers 53 of the MR elements 5 are respectively disposed near both ends of each lower electrode 62 in the longitudinal direction on the top surface of the lower electrode 62.

Each individual upper electrode 61 is long in the first reference direction RD1, and electrically connects the respective first magnetic layers 51 of two adjoining MR elements 5 respectively disposed on two lower electrodes 62 adjoining in the first reference direction RD1. According to such a configuration, each of the resistor sections R11 to R14 and R21 to R24 includes the plurality of MR elements 5 connected in series by the plurality of upper electrodes 61 and the plurality of lower electrodes 62.

The first detection circuit 10 further includes the first coil 7 described in the first example embodiment. The configuration and function of the first coil 7 of the present example embodiment are similar to the configuration and function of the first coil 7 of the first example embodiment shown in FIGS. 1 to 3 except the number of each of the coil elements 71 and 72. In the present example embodiment, the first coil 7 includes a plurality of coil elements 71 and a plurality of coil elements 72. The plurality of coil elements 71 and the plurality of coil elements 72 are connected in series or parallel.

As shown in FIG. 10, in the first detection circuit 10, each of the plurality of coil elements 71 and the plurality of coil elements 72 extends in the direction parallel to the Y direction. The plurality of coil elements 71 are arranged in the X direction. The individual coil elements 71 are disposed to overlap the plurality of MR elements 5 arranged in the Y direction when seen from above. The plurality of coil elements 72 are also disposed to overlap the plurality of MR elements 5 when seen from above as with the plurality of coil elements 71.

The first coil 7 is configured to apply a magnetic field component (a first magnetic field component) in the X direction of the first coil magnetic field to the plurality of MR elements 5 of each of the resistor sections R11 and R13, and is also configured to apply a magnetic field component (a second magnetic field component) in the −X direction of the first coil magnetic field to the plurality of MR elements 5 of each of the resistor sections R12 and R14.

The second detection circuit 20 further includes the second coil 8 described in the second example embodiment. The configuration and function of the second coil 8 of the second detection circuit 20 are similar to the configuration and function of the second coil 8 of the second example embodiment shown in FIGS. 7 and 8 except the number of each of the coil elements 81 and the not-shown coil elements. In the present example embodiment, the second coil 8 includes a plurality of coil elements 81 and a plurality of not-shown coil elements. The plurality of coil elements 81 and the plurality of not-shown coil elements are connected in series or parallel.

As shown in FIG. 11, in the second detection circuit 20, each of the plurality of coil elements 81 extends in the direction parallel to the X direction. The plurality of coil elements 81 are arranged in the Y direction. The individual coil elements 81 are disposed to overlap the plurality of MR elements 5 arranged in the X direction when seen from above. The plurality of not-shown coil elements are disposed to overlap the plurality of MR elements 5 when seen from above as with the plurality of coil elements 81.

The second coil 8 is configured to apply a magnetic field component (a third magnetic field component) in the Y direction of the second coil magnetic field to the plurality of MR elements 5 of each of the resistor sections R21 and R23, and is also configured to apply a magnetic field component (a fourth magnetic field component) in the −Y direction of the second coil magnetic field to the plurality of MR elements 5 of each of the resistor sections R22 and R24.

The first coil 7 and the second coil 8 may be controlled by the processor 30. In such a case, the processor 30 controls the first coil 7 so that the first coil magnetic field is temporarily generated, and also controls the second coil 8 so that the second coil magnetic field is temporarily generated.

The first detection circuit 10 further includes a not-shown first insulating layer interposed between the plurality of coil elements 71 and the plurality of upper electrodes 61, a not-shown second insulating layer interposed between the plurality of coil elements 72 and the plurality of lower electrodes 62, and a not-shown third insulating layer disposed around the plurality of MR elements 5 and the first coil 7. The second detection circuit 20 further includes a not-shown fourth insulating layer interposed between the plurality of coil elements 81 and the plurality of upper electrodes 61, a not-shown fifth insulating layer interposed between a not-shown plurality of coil elements and the plurality of lower electrodes 62, and a not-shown sixth insulating layer disposed around the plurality of MR elements 5 and the second coil 8.

In FIG. 9, two arrows drawn in each of the resistor sections R11 to R14 and R21 to R24 respectively represent the direction of the magnetization M1 of the first magnetic layer 51 and the direction of the magnetization M2 of the second magnetic layer 53 of the MR element 5 in the resistor section. FIG. 9 shows the directions of the magnetizations M1 and M2 in a state where the target magnetic field is not applied, that is, in the initial state.

Hereinafter, the directions of the magnetizations M1 and M2 in the initial state will be described. The direction of the magnetization M1 in each of the resistor sections R11 and R13 is oriented in the direction D1 parallel to the first reference direction RD1. The direction of the magnetization M2 in each of the resistor sections R11 and R13 is oriented in the direction D2 parallel to the second reference direction RD2. The direction of the magnetization M1 in each of the resistor sections R12 and R14 is oriented in the direction opposite to the direction D1. The direction of the magnetization M2 in each of the resistor sections R12 and R14 is oriented in the direction opposite to the direction D2.

The direction of the magnetization M1 in each of the resistor sections R21 and R23 is oriented in the direction D1. The direction of the magnetization M2 in each of the resistor sections R21 and R23 is oriented in the direction D3 parallel to the second reference direction RD2. The direction of the magnetization M1 in each of the resistor sections R22 and R24 is oriented in the direction opposite to the direction D1. The direction of the magnetization M2 in each of the resistor sections R22 and R24 is oriented in the direction opposite to the direction D3.

The first coil magnetic field of the first coil 7 of the first detection circuit 10 is used to set the direction of each of the magnetizations M1 and M2 in the resistor sections R11 to R14 to the direction in the initial state, that is, to reset the direction of each of the magnetizations M1 and M2. The operation of the first coil 7 for the resistor sections R11 and R13 is the same as the operation of the first coil 7 described with reference to FIG. 6. The operation of the first coil 7 for the resistor sections R12 and R14 is the same as the operation of the first coil 7 described with reference to FIG. 6 except the point that the direction of the magnetic field component is the −X direction.

The second coil magnetic field of the second coil 8 of the second detection circuit 20 is used to set the direction of each of the magnetizations M1 and M2 in the resistor sections R21 to R24 to the direction in the initial state, that is, to reset the direction of each of the magnetizations M1 and M2. The operation of the second coil 8 for the resistor sections R21 and R23 is the same as the operation of the second coil 8 described with reference to FIG. 8. The operation of the second coil 8 for the resistor sections R22 and R24 is the same as the operation of the second coil 8 described with reference to FIG. 8 except the point that the direction of the magnetic field component is the −Y direction.

Figure 12:
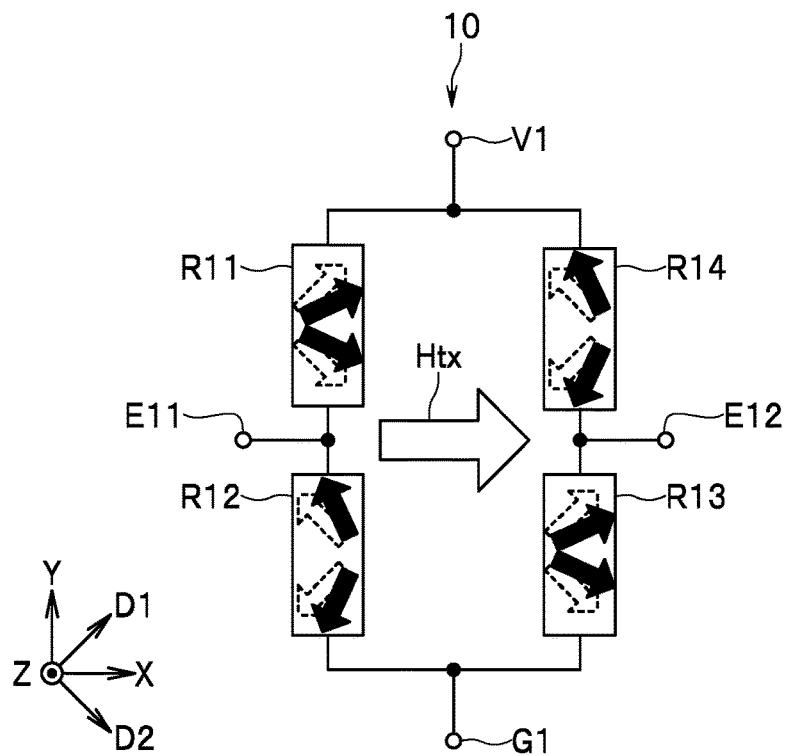
FIG. 12 is an explanatory view for illustrating an operation of the first detection circuit of the magnetic sensor according to the third example embodiment of the technology.
Figure 13:
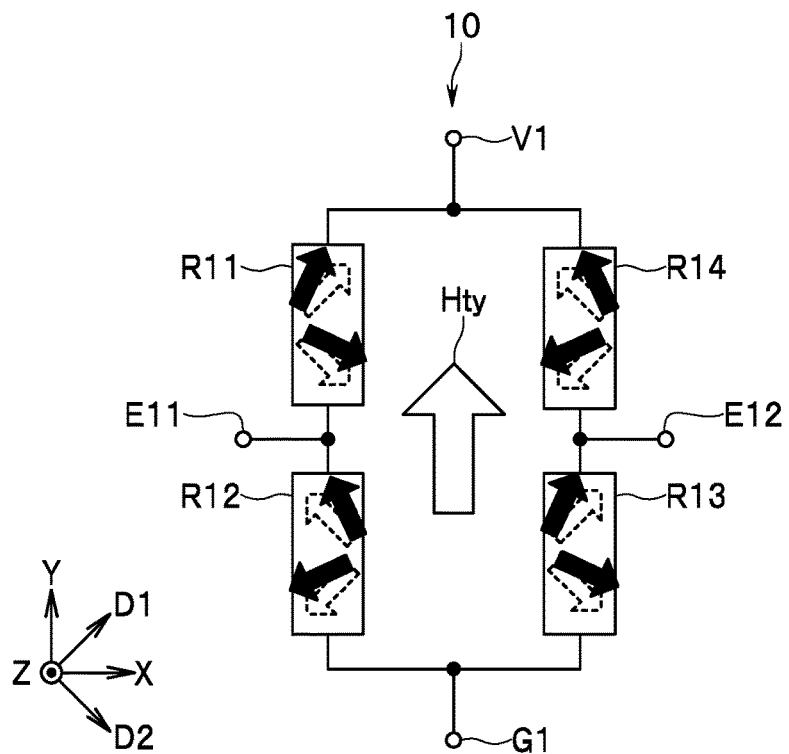
FIG. 13 is an explanatory view for illustrating an operation of the first detection circuit of the magnetic sensor according to the third example embodiment of the technology.

Next, the operation of the magnetic sensor 100 will be described. First, the operation of the first detection circuit 10 will be described with reference to FIGS. 12 and 13. FIGS. 12 and 13 are explanatory views for illustrating the operation of the first detection circuit 10. In FIGS. 12 and 13, solid arrows drawn in each of the resistor sections R11 to R14 respectively represent the directions of the magnetizations M1 and M2. In FIGS. 12 and 13, dashed arrows drawn in each of the resistor sections R11 to R14 respectively represent the directions of the magnetizations M1 and M2 in the initial state.

FIG. 12 shows a case where a magnetic field component Htx in the direction parallel to the X direction of a target magnetic field is applied to the first detection circuit 10, and the direction of the magnetic field component Htx is the X direction. In such a case, in each of the resistor sections R11 and R13, the magnetization M1 is inclined in the X direction from the direction D1, and the magnetization M2 is inclined in the X direction from the direction D2. In addition, in such a case, in each of the resistor sections R12 and R14, the magnetization M1 is inclined in the Y direction from the direction opposite to the direction D1, and the magnetization M2 is inclined in the −Y direction from the direction opposite to the direction D2. Consequently, the resistance value of each of the resistor sections R11 and R13 decreases and the resistance value of each of the resistor sections R12 and R14 increases in comparison with a state in which there exists no magnetic field component Htx.

Contrary to the foregoing case, in a case where the direction of the magnetic field component Htx is the −X direction, the resistance value of each of the resistor sections R11 and R13 increases and the resistance value of each of the resistor sections R12 and R14 decreases in comparison with a state in which there exists no magnetic field component Htx.

The amount of change in the resistance value of each of the resistor sections R11 to R14 depends on the strength of the magnetic field component Htx. When the direction and strength of the magnetic field component Htx change, the resistance value of each of the resistor sections R11 to R14 changes such that the resistance value of each of the resistor sections R11 and R13 increases and the resistance value of each of the resistor sections R12 and R14 decreases, or the resistance value of each of the resistor sections R11 and R13 decreases and the resistance value of each of the resistor sections R12 and R14 increases. Thereby the potential of each of the output ports E11 and E12 changes, and also the potential difference between the output ports E11 and E12 changes. The difference detector 15 (see FIG. 9) outputs a signal corresponding to the potential difference between the output ports E11 and E12 as the first detection signal S1.

The first detection signal S1 has a correspondence with the potential of the connecting point between the MR element 5 of the resistor section R11 and the MR element 5 of the resistor section R12, that is, the potential of the output port E11, and also has a correspondence with the potential of the connecting point between the MR element 5 of the resistor section R13 and the MR element 5 of the resistor section R14, that is, the potential of the output port E12. Thus, the first detection signal S1 has a correspondence with the direction and strength of the magnetic field component Htx.

FIG. 13 shows a case where a magnetic field component Hty in the direction parallel to the Y direction of a target magnetic field is applied to the first detection circuit 10, and the direction of the magnetic field component Hty is the Y direction. In such a case, in each of the resistor sections R11 and R13, the magnetization M1 is inclined in the Y direction from the direction D1, and the magnetization M2 is inclined in the X direction from the direction D2. In addition, in such a case, in each of the resistor sections R12 and R14, the magnetization M1 is inclined in the −X direction from the direction opposite to the direction D1, and the magnetization M2 is inclined in the Y direction from the direction opposite to the direction D2. Consequently, the resistance value of each of the resistor sections R11 to R14 does not change or hardly changes.

In a case where the direction of the magnetic field component Hty is the −Y direction, the resistance value of each of the resistor sections R11 to R14 does not change or hardly changes as in the foregoing case. Thus, in a case where the magnetic field component Hty is applied to the first detection circuit 10, the potential difference between the output ports E11 and E12 does not change or hardly changes.

As described above, the first detection circuit 10 has sensitivity to the magnetic field component Htx, but has no sensitivity to the magnetic field component Hty.

Figure 14:
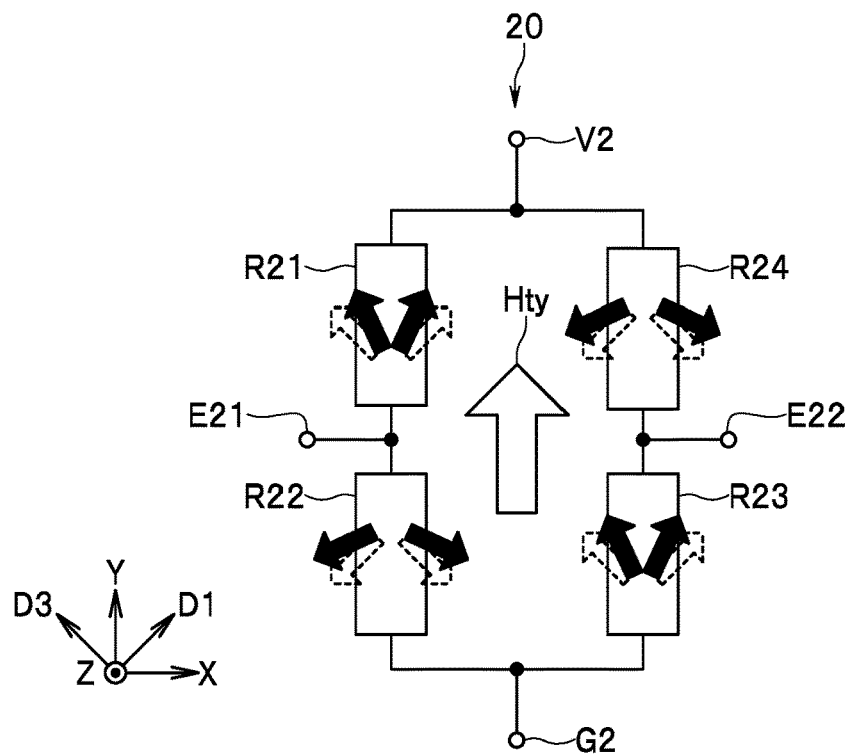
FIG. 14 is an explanatory view for illustrating an operation of the second detection circuit of the magnetic sensor according to the third example embodiment of the technology.
Figure 15:
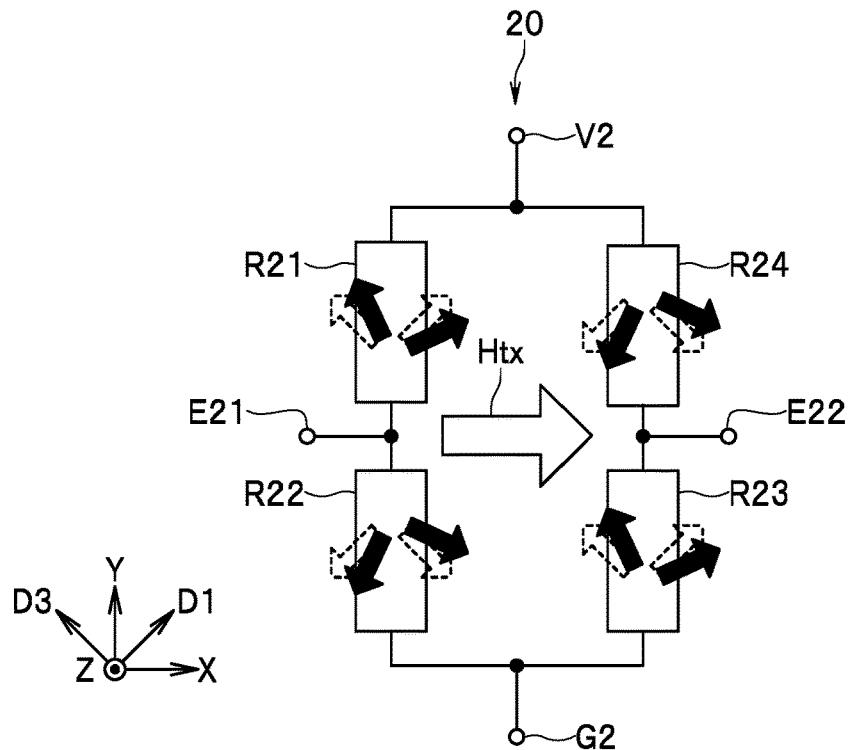
FIG. 15 is an explanatory view for illustrating an operation of the second detection circuit of the magnetic sensor according to the third example embodiment of the technology.

Next, the operation of the second detection circuit 20 will be described with reference to FIGS. 14 and 15. FIGS. 14 and 15 are explanatory views for illustrating the operation of the second detection circuit 20. In FIGS. 14 and 15, solid arrows drawn in each of the resistor sections R21 to R24 respectively represent the directions of the magnetizations M1 and M2. In FIGS. 14 and 15, dashed arrows drawn in each of the resistor sections R21 to R24 respectively represent the directions of the magnetizations M1 and M2 in the initial state.

FIG. 14 shows a case where a magnetic field component Hty is applied to the second detection circuit 20, and the direction of the magnetic field component Hty is the Y direction. In such a case, in each of the resistor sections R21 and R23, the magnetization M1 is inclined in the Y direction from the direction D1, and the magnetization M2 is inclined in the Y direction from the direction D3. In addition, in such a case, in each of the resistor sections R22 and R24, the magnetization M1 is inclined in the −X direction from the direction opposite to the direction D1, and the magnetization M2 is inclined in the X direction from the direction opposite to the direction D3. Consequently, the resistance value of each of the resistor sections R21 and R23 decreases and the resistance value of each of the resistor sections R22 and R24 increases in comparison with a state in which there exists no magnetic field component Hty.

Contrary to the foregoing case, in a case where the direction of the magnetic field component Hty is the −Y direction, the resistance value of each of the resistor sections R21 and R23 increases and the resistance value of each of the resistor sections R22 and R24 decreases in comparison with a state in which there exists no magnetic field component Hty.

The amount of change in the resistance value of each of the resistor sections R21 to R24 depends on the strength of the magnetic field component Hty. When the direction and strength of the magnetic field component Hty change, the resistance value of each of the resistor sections R21 to R24 changes such that the resistance value of each of the resistor sections R21 and R23 increases and the resistance value of each of the resistor sections R22 and R24 decreases, or the resistance value of each of the resistor sections R21 and R23 decreases and the resistance value of each of the resistor sections R22 and R24 increases. Thereby the potential of each of the output ports E21 and E22 changes, and also the potential difference between the output ports E21 and E22 changes. The difference detector 25 (see FIG. 9) outputs a signal corresponding to the potential difference between the output ports E21 and E22 as the second detection signal S2.

The second detection signal S2 has a correspondence with the potential of the connecting point between the MR element 5 of the resistor section R21 and the MR element 5 of the resistor section R22, that is, the potential of the output port E21, and also has a correspondence with the potential of the connecting point between the MR element 5 of the resistor section R23 and the MR element 5 of the resistor section R24, that is, the potential of the output port E22. Thus, the second detection signal S2 has a correspondence with the direction and strength of the magnetic field component Hty.

FIG. 15 shows a case where a magnetic field component Htx is applied to the first detection circuit 10, and the direction of the magnetic field component Htx is the X direction. In such a case, in each of the resistor sections R21 and R23, the magnetization M1 is inclined in the X direction from the direction D1, and the magnetization M2 is inclined in the Y direction from the direction D3. In addition, in such a case, in each of the resistor sections R22 and R24, the magnetization M1 is inclined in the −Y direction from the direction opposite to the direction D1, and the magnetization M2 is inclined in the X direction from the direction opposite to the direction D3. Consequently, the resistance value of each of the resistor sections R21 to R24 does not change or hardly changes.

In a case where the direction of the magnetic field component Htx is the −X direction, the resistance value of each of the resistor sections R21 to R24 does not change or hardly changes as in the foregoing case. Thus, in a case where the magnetic field component Htx is applied to the second detection circuit 20, the potential difference between the output ports E21 and E22 does not change or hardly changes.

As described above, the second detection circuit 20 has sensitivity to the magnetic field component Hty, but has no sensitivity to the magnetic field component Htx.

Next, an example of a method for generating the detection value Vs with the processor 30 will be described. Hereinafter, description will be made of a case where a value, which represents the angle that the direction of a component parallel to the XY plane of a target magnetic field forms with respect to the X direction, is generated as the detection value Vs. In such a case, the processor 30 calculates Vs using the following Eq. (1), for example.

$$Vs = \operatorname{atan}(S2/S1) \quad (1)$$

"atan" represents arctangent.

For Vs ranging from 0° to less than 360°, Eq. (1) yields two solutions of Vs that are 180° different in value. Which of the two solutions of Vs in Eq. (1) is the true value of Vs can be determined in accordance with the combination of the signs of S1 and S2. The processor 30 determines Vs within the range of 0° to less than 360° in accordance with Eq. (1) and the determination on the combination of the signs of S1 and S2.

In the present example embodiment, the first detection circuit 10 includes the first coil 7, and the second detection circuit 20 includes the second coil 8. The processor 30 may be configured to generate the detection value Vs using the first detection signal S1 generated after temporarily generating the first coil magnetic field by controlling the first coil 7, and the second detection signal S2 generated after temporarily generating the second coil magnetic field by controlling the second coil 8. In other words, the processor 30 may generate the detection value Vs using the first detection signal S1 obtained after resetting is performed with the first coil 7, and the second detection signal S2 obtained after resetting is performed with the second coil 8. This can suppress errors in the detection value Vs.

The configuration, operation and effects of the present example embodiment are otherwise the same as those of the first or second example embodiment.

Fourth Example Embodiment

Figure 16:
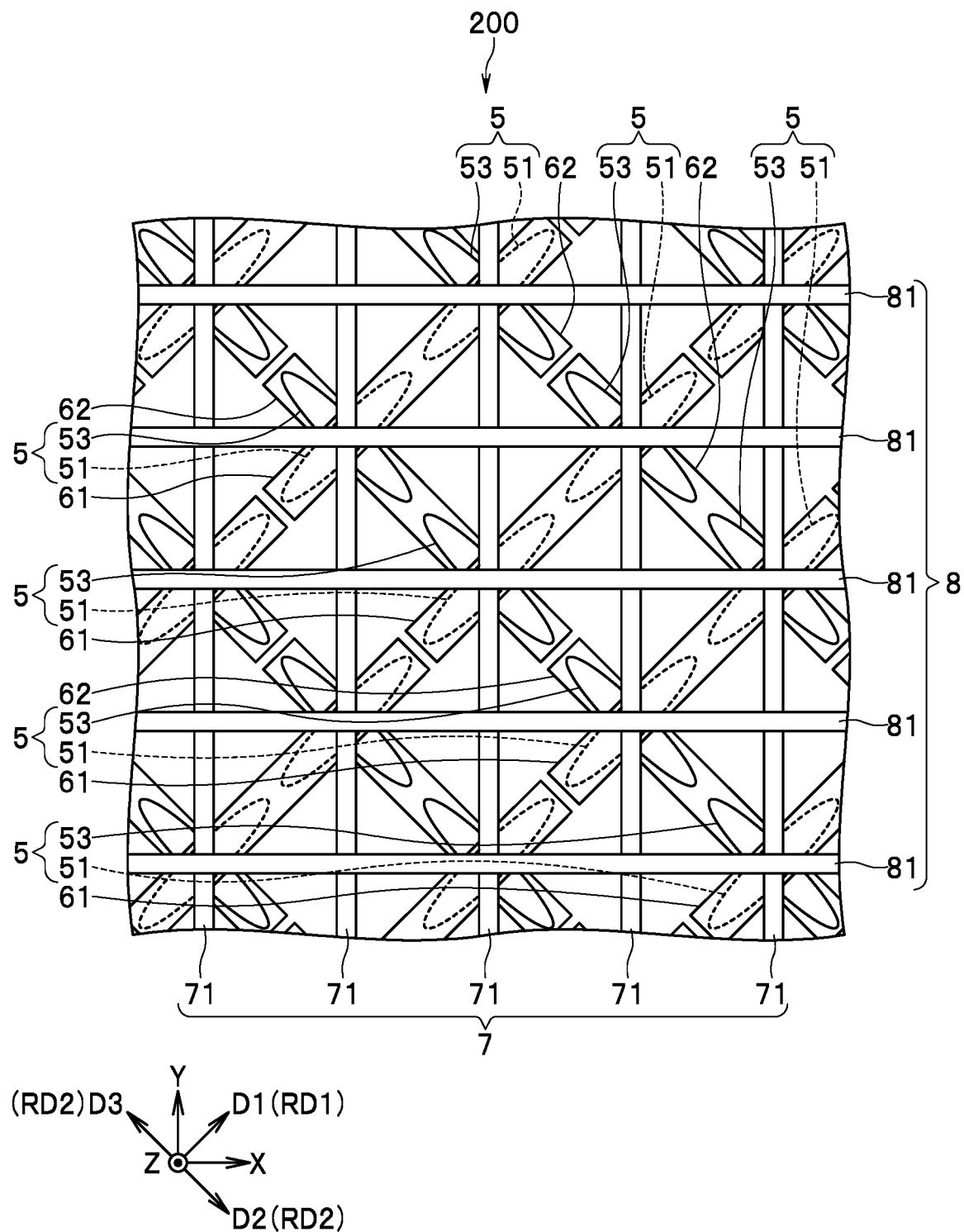
FIG. 16 is a plan view showing a part of a magnetic sensor according to a fourth example embodiment of the technology.

A fourth example embodiment of the technology will now be described with reference to FIG. 16. FIG. 16 is a plan view showing a part of a magnetic sensor according to the present example embodiment.

The configuration of a magnetic sensor 200 according to the present example embodiment is the same as the configuration of the magnetic sensor 100 according to the third example embodiment except the first and second coils 7 and 8. In the present example embodiment, each of the first and second detection circuits 10 and 20 (see FIG. 9) of the magnetic sensor 200 includes both the first coil 7 and the second coil 8. The configuration of the first coil 7 of the magnetic sensor 200 is the same as the configuration of the first coil 7 of the first detection circuit 10 of the third example embodiment. The configuration of the second coil 8 of the magnetic sensor 200 is the same as the configuration of the second coil 8 of the second detection circuit 20 of the third example embodiment. For the first detection circuit 10, only the first coil 7 is used. For the second detection circuit 20, only the second coil 8 is used.

According to the magnetoresistive device 101 according to the present example embodiment, the first detection circuit 10 and the second detection circuit 20 can be exchanged. Specifically, the resistor sections R11 to R14 can be configured by setting the directions of the magnetizations M1 and M2 with the first coil 7, and the resistor sections R21 to R24 can be configured by setting the directions of the magnetizations M1 and M2 with the second coil 8.

The configuration, operation and effects of the present example embodiment are otherwise the same as those of the third example embodiment.

Fifth Example Embodiment

Figure 17:
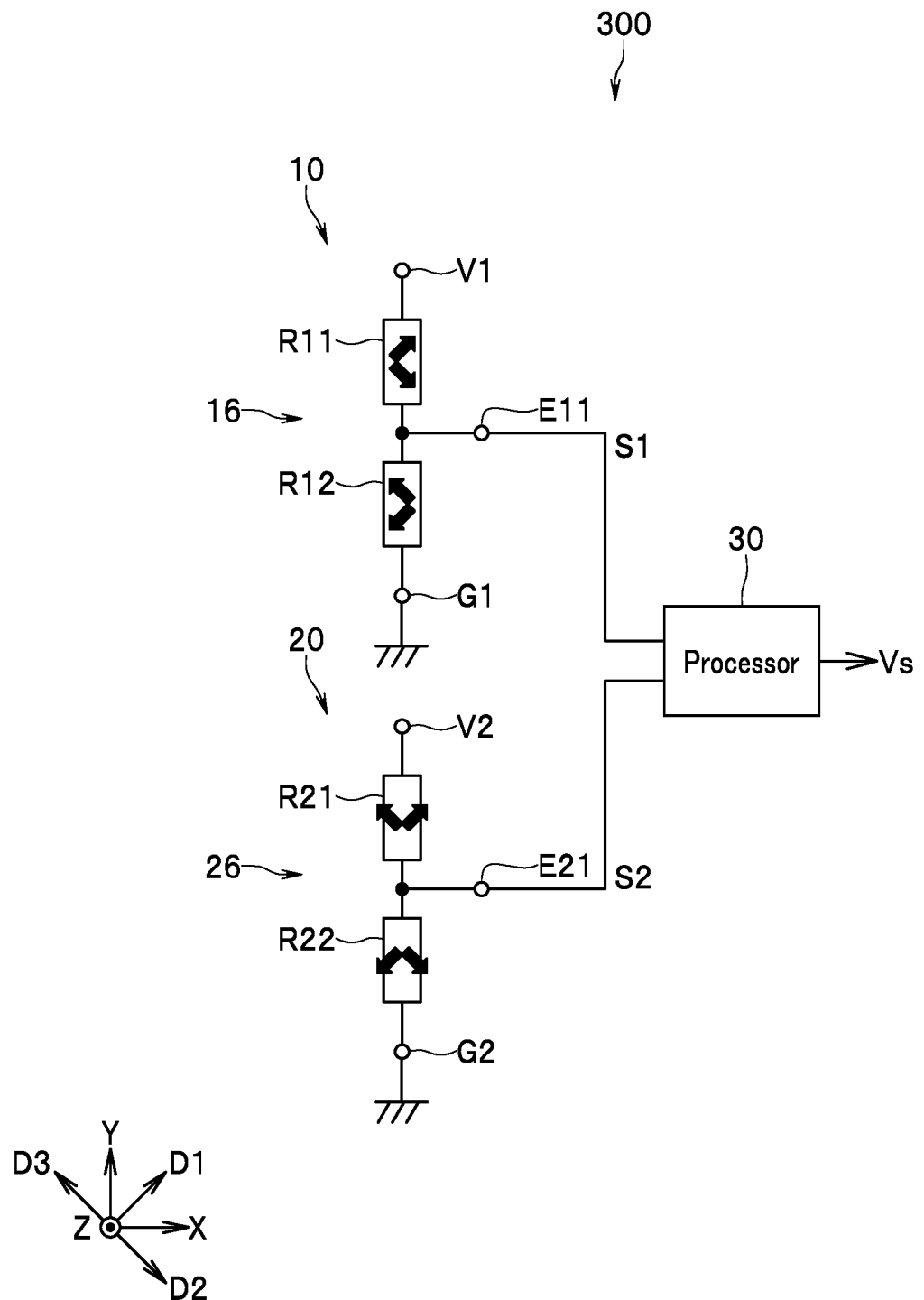
FIG. 17 is a circuit diagram showing a configuration of a magnetic sensor according to a fifth example embodiment of the technology.

A fifth example embodiment of the technology will now be described with reference to FIG. 17. FIG. 17 is a circuit diagram showing a configuration of a magnetic sensor according to the present example embodiment.

A configuration of a magnetic sensor 300 according to the present example embodiment differs from the configuration of the magnetic sensor 100 according to the third example embodiment in the following point. In the present example embodiment, the first detection circuit 10 is not provided with the resistor sections R13 and R14, the output port E12, and the difference detector 15 of the third example embodiment. The resistor sections R11 and R12 constitute a half-bridge circuit 16. The first detection circuit 10 outputs a signal corresponding to the potential of the output port E11 as the first detection signal S1.

In the present example embodiment, the second detection circuit 20 is not provided with the resistor sections R23 and R24, the output port E22, and the difference detector 25 of the third example embodiment. The resistor sections R21 and R22 constitute a half-bridge circuit 26. The second detection circuit 20 outputs a signal corresponding to the potential of the output port E21 as the second detection signal S2.

The configuration of each of the first and second coils 7 and 8 may be the same as the configuration in the third example embodiment or the configuration in the fourth example embodiment. The configuration, operation and effects of the present example embodiment are otherwise the same as those of the third or fourth example embodiment.

Sixth Example Embodiment

Figure 18:
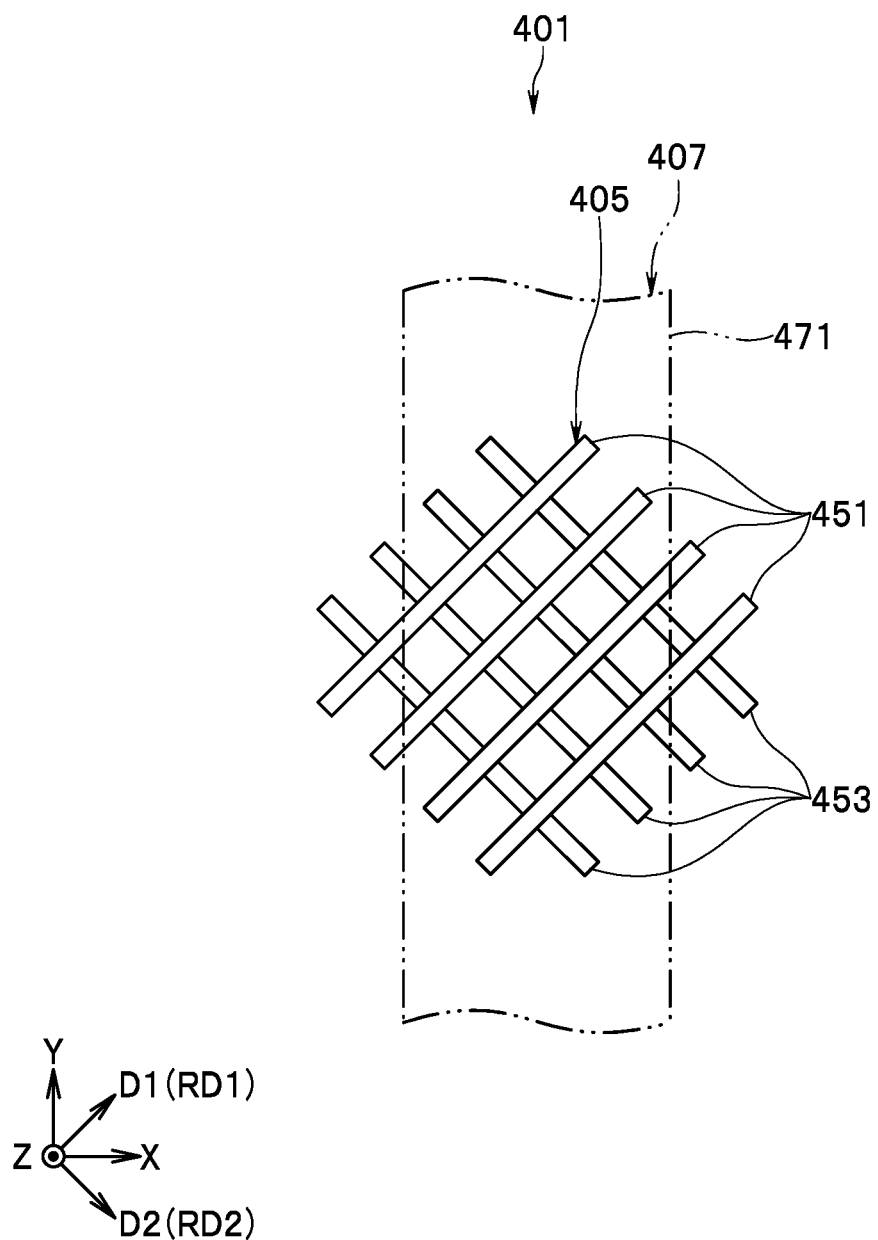
FIG. 18 is a plan view showing a main part of a magnetoresistive device according to a sixth example embodiment of the technology.

A sixth example embodiment of the technology will now be described with reference to FIG. 18. FIG. 18 is a plan view showing a main part of a magnetoresistive device according to the present example embodiment.

A configuration of a magnetoresistive device 401 according to the present example embodiment differs from the configuration of the magnetoresistive device 1 according to the first example embodiment in the following point. In other words, the magnetoresistive device 401 according to the present example embodiment includes an MR element 405 according to the present example embodiment instead of the MR element 5 according to the first example embodiment. A configuration of the MR element 405 is basically the same as the configuration of the MR element 5 according to the first example embodiment. The MR element 405 according to the present example embodiment includes a first magnetic layer 451 and a second magnetic layer 453 instead of the first magnetic layer 51 and the second magnetic layer 53 of the first example embodiment.

The first magnetic layer 451 includes a plurality of first portions isolated from one another. The magnetic shape anisotropy and magnetization of each of the plurality of first portions are the same as the magnetic shape anisotropy and the magnetization M1 of the first magnetic layer 51 of the first example embodiment. As shown in FIG. 18, each of the plurality of first portions is long in the first reference direction RD1 when seen from above.

The second magnetic layer 453 includes a plurality of second portions isolated from one another. The magnetic shape anisotropy and magnetization of each of the plurality of second portions are the same as the magnetic shape anisotropy and the magnetization M2 of the second magnetic layer 53 of the first example embodiment. As shown in FIG. 18, each of the plurality of second portions is long in the second reference direction RD2 when seen from above.

The plurality of first portions of the first magnetic layer 451 and the plurality of second portions of the second magnetic layer 453 are arranged in a lattice pattern when seen from above. As shown in FIG. 18, the plurality of first portions are disposed to be arranged in the second reference direction RD2, and the plurality of second portions are disposed to be arranged in the first reference direction RD1.

The resistance value of the MR element 405 changes depending on the angle formed by the magnetization direction of each of the plurality of first portions of the first magnetic layer 451 and the magnetization direction of each of the plurality of second portions of the second magnetic layer 453, and the resistance value becomes higher as the angle is larger.

The magnetoresistive device 401 according to the present example embodiment includes a first coil 407 instead of the first coil 7 of the first example embodiment. The first coil 407 is configured to generate the first coil magnetic field described in the first example embodiment. The first coil 407 includes coil elements 471 that generate the first coil magnetic field. Each of the coil elements 471 extends in the direction parallel to the Y direction. The coil elements 471 are disposed above the MR elements 405. The first coil 407 may further include not-shown coil elements disposed below the MR elements 405 as with the first coil 7 of the first example embodiment.

The operation of the MR element 405 is basically the same as the operation of the MR element 5 described in the first example embodiment. Replacing the first magnetic layer 51 and the second magnetic layer 53 in the description of the operation of the MR element 5 with the first portions of the first magnetic layer 451 and the second portions of the second magnetic layer 453, respectively, can provide a description of the operation of the MR element 405.

The operation of the first coil 407 is basically the same as the operation of the first coil 7 described in the first example embodiment. Replacing the first magnetic layer 51, the second magnetic layer 53, the first coil 7, the coil elements 71, and the coil elements 72 in the description of the operation of the first coil 7 with the first portions of the first magnetic layer 451, the second portions of the second magnetic layer 453, the first coil 407, the coil elements 471, and the not-shown coil elements, respectively, can provide a description of the operation of the first coil 407.

According to the present example embodiment, the number of portions where the first magnetic layer 451 and the second magnetic layer 453 are connected via the nonmagnetic layer 52 (see FIG. 3) (hereinafter referred to as junction portions) can be increased in comparison with the first example embodiment. Thereby according to the present example embodiment, the influence of disturbance, such as noise magnetic fields, can be reduced.

According to the present example embodiment, since the number of junction portions is increased, the configuration of each of the upper electrodes 61 and the lower electrodes 62 (see FIG. 3) can be simplified more in comparison with a case where the plurality of MR elements 5 according to the first example embodiment are provided. Thereby according to the present example embodiment, the magnetoresistive device 401 can be produced easily.

Note that the magnetoresistive device 401 according to the present example embodiment may include a second coil configured to generate the second coil magnetic field in addition to the MR elements 405 and the first coil 407 as with the magnetoresistive device 101 according to the second example embodiment. The configuration, operation and effects of the present example embodiment are otherwise the same as those of the first or second example embodiment.

Seventh Example Embodiment

Figure 19:
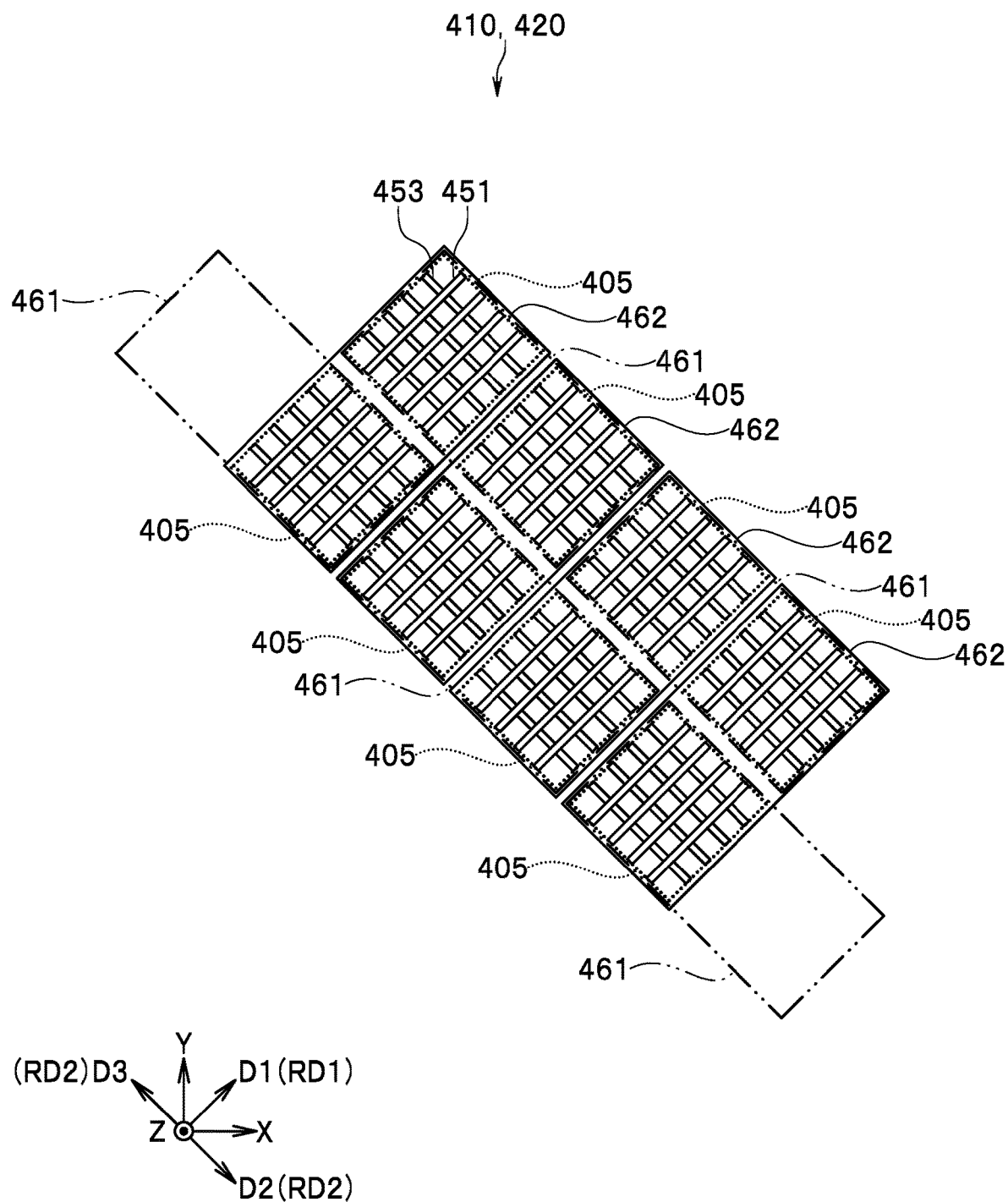
FIG. 19 is a plan view showing a part of a first detection circuit of a magnetic sensor according to a seventh example embodiment of the technology.
Figure 20:
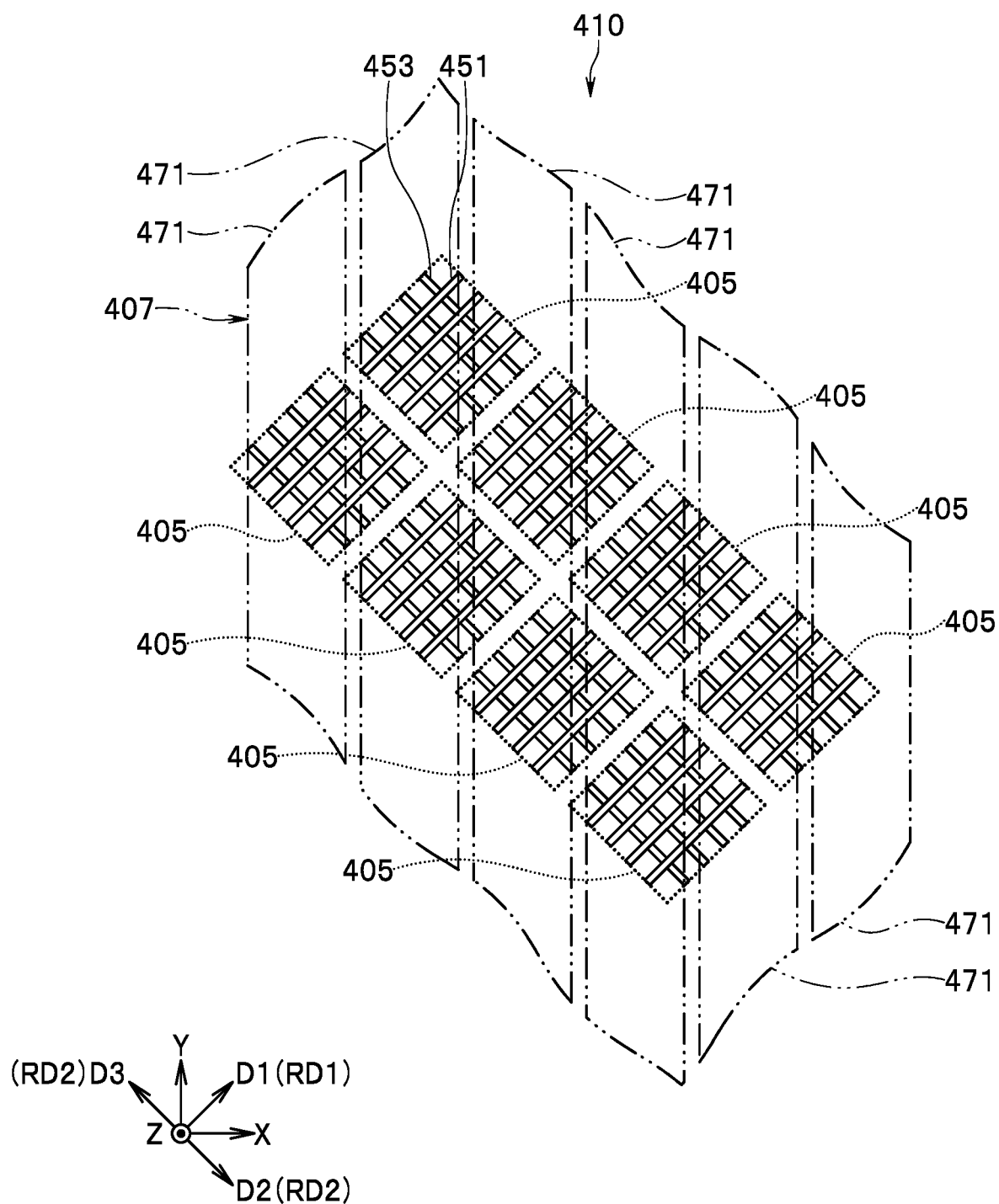
FIG. 20 is a plan view showing a part of the first detection circuit of the magnetic sensor according to the seventh example embodiment of the technology.
Figure 21:
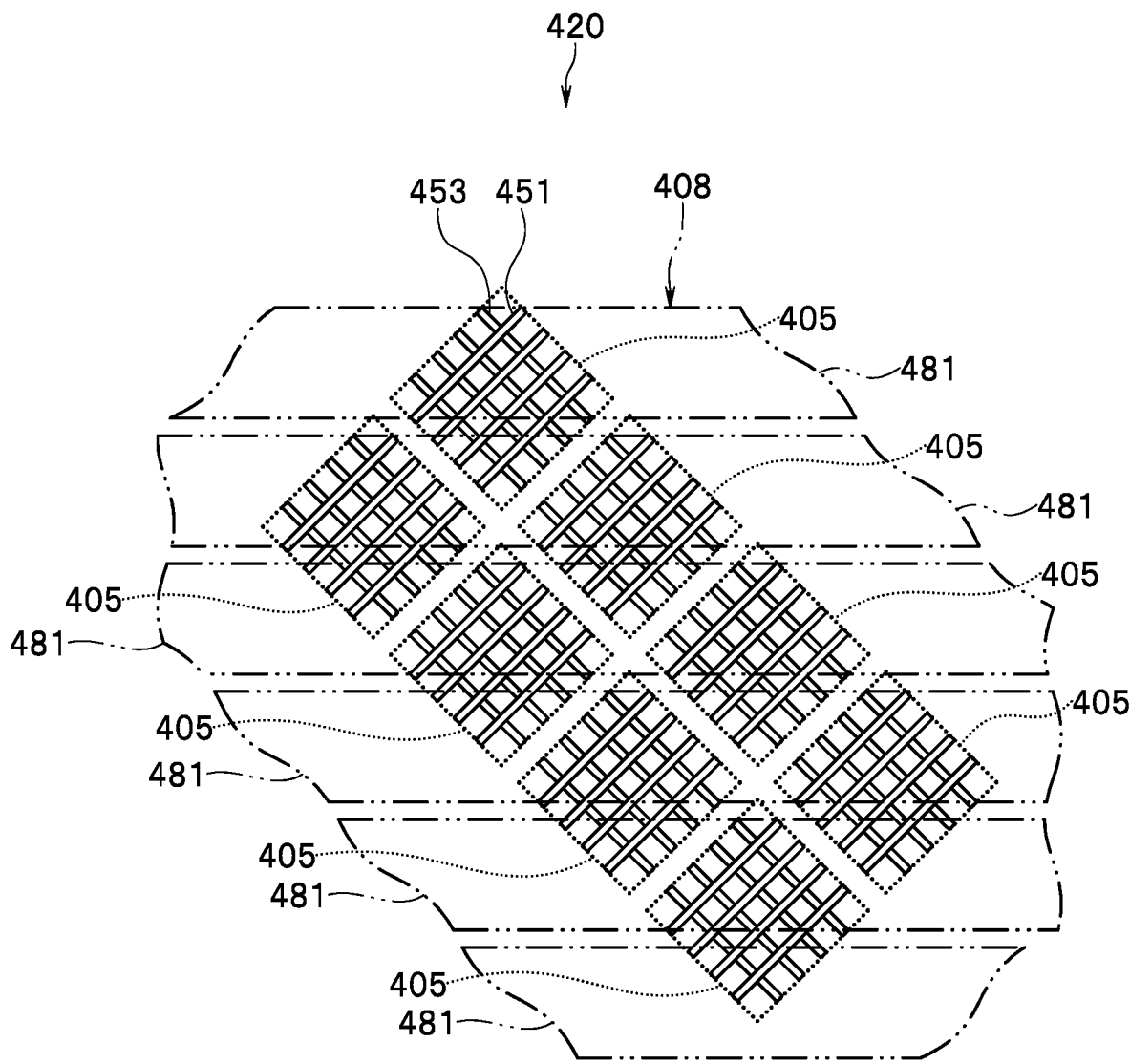
FIG. 21 is a plan view showing a part of a second detection circuit of the magnetic sensor according to the seventh example embodiment of the technology.
Figure 21:
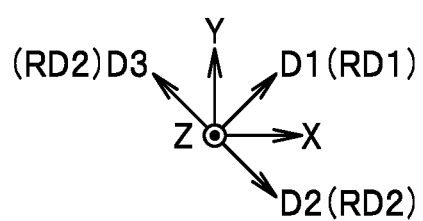

A seventh example embodiment of the technology will now be described. FIGS. 19 and 20 are plan views each showing a part of a first detection circuit of a magnetic sensor according to the present example embodiment. FIG. 21 is a plan view showing a part of a second detection circuit of the magnetic sensor according to the present example embodiment.

The configuration of the magnetic sensor according to the present example embodiment differs from the configuration of the magnetic sensor 100 according to the third example embodiment in the following point. In other words, in the present example embodiment, each of a plurality of MR elements included in the magnetic sensor is the MR element 405 described in the sixth example embodiment.

The magnetic sensor according to the present example embodiment includes a first detection circuit 410 and a second detection circuit 420 instead of the first detection circuit 10 and the second detection circuit 20 of the third example embodiment. The circuit configuration and operation of the first detection circuit 410 are the same as the circuit configuration (see FIG. 9) and operation of the first detection circuit 10 of the third example embodiment. The circuit configuration and operation of the second detection circuit 420 are the same as the circuit configuration (see FIG. 9) and operation of the second detection circuit 20 of the third example embodiment.

FIGS. 19 and 20 each show a part of one of the resistor sections R11 to R14 (see FIG. 9) of the first detection circuit 410. FIG. 21 shows a part of one of the resistor sections R21 to R24 (see FIG. 9) of the second detection circuit 420. Each of the resistor sections R11 to R14 and R21 to R24 of the present example embodiment includes the plurality of MR elements 405 instead of the plurality of MR elements 5. The plurality of MR elements 405 are arranged in a lattice pattern when seen from above. In other words, the plurality of MR elements 405 are arranged such that two or more MR elements 405 are arranged in each of the first reference direction RD1 and the second reference direction RD2.

Each of the resistor sections R11 to R14 and R21 to R24 of the present example embodiment includes a plurality of upper electrodes 461 and a plurality of lower electrodes 462 instead of the plurality of upper electrodes 61 and the plurality of lower electrodes 62 of the third example embodiment. Each individual lower electrode 462 is long in the first reference direction RD1. As shown in FIG. 19, the second magnetic layers 453 of the MR elements 405 are respectively disposed near both ends of each lower electrode 462 in the longitudinal direction on the top surface of the lower electrode 462.

Each individual upper electrode 461 is long in the second reference direction RD2, and electrically connects the respective first magnetic layers 451 of two MR elements 405 adjoining in the second reference direction RD2. According to such a configuration, each of the resistor sections R11 to R14 and R21 to R24 includes the plurality of MR elements 405 connected in series by the plurality of upper electrodes 461 and the plurality of lower electrodes 462. Note that in FIG. 20, the plurality of upper electrodes 461 and the plurality of lower electrodes 462 are omitted.

The first detection circuit 410 further includes the first coil 407. The configuration and operation of the first coil 407 are similar to the configuration and operation of the first coil 7 of the third example embodiment. The first coil 407 includes the plurality of coil elements 471 corresponding to the plurality of coil elements 71 of the first coil 7, and a plurality of first coil elements (not shown) corresponding to the plurality of coil elements 72 of the first coil 7. Note that in FIG. 19, the first coil 407 is omitted.

The second detection circuit 420 further includes a second coil 408. The configuration and operation of the second coil 408 are similar to the configuration and operation of the second coil 8 of the third example embodiment. The second coil 408 includes a plurality of coil elements 481 corresponding to the plurality of coil elements 81 of the second coil 8, and a plurality of second coil elements (not shown) corresponding to the plurality of not-shown coil elements of the second coil 8.

The configuration, operation and effects of the present example embodiment are otherwise the same as those of the third or sixth example embodiment.

The technology is not limited to the foregoing example embodiments, and various modifications may be made thereto. For example, the plurality of coil elements 71 and the plurality of coil elements 72 may overlap one MR element 5 when seen from above. Similarly, the plurality of coil elements 81 and the plurality of not-shown coil elements may overlap one MR element 5 when seen from above.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetoresistive element having a resistance value that changes depending on an external magnetic field, comprising:
    a first magnetic layer having a magnetic shape anisotropy set in a first reference direction and having a magnetization whose direction changes depending on the external magnetic field, the magnetization being oriented in a first magnetization direction that is one direction parallel to the first reference direction in a state where the external magnetic field is not applied;
    a second magnetic layer having a magnetic shape anisotropy set in a second reference direction intersecting with the first reference direction and having a magnetization whose direction changes depending on the external magnetic field, the magnetization being oriented in a second magnetization direction that is one direction parallel to the second reference direction in a state where the external magnetic field is not applied; and
    a nonmagnetic layer disposed between the first magnetic layer and the second magnetic layer.

2. The magnetoresistive element according to claim 1, wherein the first reference direction and the second reference direction are orthogonal to each other.

3. The magnetoresistive element according to claim 1, wherein the nonmagnetic layer is a tunnel barrier layer.

4. The magnetoresistive element according to claim 1, wherein
    the first magnetic layer includes a plurality of first portions isolated from one another, and
    the second magnetic layer includes a plurality of second portions isolated from one another.

5. The magnetoresistive element according to claim 4, wherein the plurality of first portions and the plurality of second portions are arranged in a lattice pattern when seen in one direction orthogonal to each of the first reference direction and the second reference direction.

6. The magnetoresistive element according to claim 4, wherein
    each of the plurality of first portions has a magnetic shape anisotropy set in the first reference direction, and has a magnetization whose direction changes depending on the external magnetic field, the magnetization being oriented in the first magnetization direction in a state where the external magnetic field is not applied, and
    each of the plurality of second portions has a magnetic shape anisotropy set in the second reference direction, and has a magnetization whose direction changes depending on the external magnetic field, the magnetization being oriented in the second magnetization direction in a state where the external magnetic field is not applied.

7. The magnetoresistive element according to claim 1, wherein a bias magnetic field generator is not provided that applies a bias magnetic field to each of the first magnetic layer and the second magnetic layer.

8. A magnetoresistive device comprising:
the magnetoresistive element according to claim 1; and
a first coil configured to generate a first coil magnetic field, wherein
the first coil is configured to apply to each of the first magnetic layer and the second magnetic layer a first magnetic field component of the first coil magnetic field in a first magnetic field direction that is a direction between the first reference direction and the second reference direction.

9. The magnetoresistive device according to claim 8, wherein the first coil includes a first coil element that generates the first coil magnetic field and extends in a direction intersecting with each of the first reference direction and the second reference direction.

10. The magnetoresistive device according to claim 8, further comprising a second coil configured to generate a second coil magnetic field, wherein
the second coil is configured to apply to each of the first magnetic layer and the second magnetic layer a second magnetic field component of the second coil magnetic field in a second magnetic field direction that is a direction between the first reference direction and the second reference direction, one of the first reference direction and the second reference direction being present between the first magnetic field direction and the second magnetic field direction.

11. The magnetoresistive device according to claim 10, wherein the second coil includes a second coil element that generates the second coil magnetic field and extends in a direction intersecting with each of the first reference direction and the second reference direction.

12. A magnetic sensor comprising a plurality of magnetoresistive elements, the magnetic sensor being configured to detect a target magnetic field to be detected and generate at least one detection signal, wherein:
each of the plurality of magnetoresistive elements is the magnetoresistive element according to claim 1.

13. The magnetic sensor according to claim 12, wherein
the plurality of magnetoresistive elements include at least one first magnetoresistive element and at least one second magnetoresistive element connected in series with the at least one first magnetoresistive element,
the first magnetization direction of the at least one first magnetoresistive element and the first magnetization direction of the at least one second magnetoresistive element are opposite directions,
the second magnetization direction of the at least one first magnetoresistive element and the second magnetization direction of the at least one second magnetoresistive element are opposite directions, and
the at least one detection signal includes a first detection signal having a correspondence with a potential of a connecting point between the at least one first magnetoresistive element and the at least one second magnetoresistive element.

14. The magnetic sensor according to claim 13, wherein
the plurality of magnetoresistive elements include at least one third magnetoresistive element and at least one fourth magnetoresistive element connected in series with the at least one third magnetoresistive element,
the first magnetization direction of the at least one third magnetoresistive element and the first magnetization direction of the at least one fourth magnetoresistive element are opposite directions,
the second magnetization direction of the at least one third magnetoresistive element and the second magnetization direction of the at least one fourth magnetoresistive element are opposite directions, and
the at least one detection signal further includes a second detection signal having a correspondence with a potential of a connecting point between the at least one third magnetoresistive element and the at least one fourth magnetoresistive element.

15. The magnetic sensor according to claim 14, further comprising:
a first coil configured to generate a first coil magnetic field; and
a second coil configured to generate a second coil magnetic field, wherein
the first coil is configured to apply to the at least one first magnetoresistive element a first magnetic field component of the first coil magnetic field in a first magnetic field direction that is a direction between the first magnetization direction and the second magnetization direction of the at least one first magnetoresistive element, and is also configured to apply to the at least one second magnetoresistive element a second magnetic field component of the first coil magnetic field in a second magnetic field direction opposite to the first magnetic field direction, and
the second coil is configured to apply to the at least one third magnetoresistive element a third magnetic field component of the second coil magnetic field in a third magnetic field direction that is a direction between the first magnetization direction and the second magnetization direction of the at least one third magnetoresistive element, and is also configured to apply to the at least one fourth magnetoresistive element a fourth magnetic field component of the second coil magnetic field in a fourth magnetic field direction opposite to the third magnetic field direction.

16. The magnetic sensor according to claim 15, further comprising a processor configured to generate a detection value having a correspondence with the target magnetic field to be detected based on the first detection signal generated after temporarily generating the first coil magnetic field and the second detection signal generated after temporarily generating the second coil magnetic field.

17. The magnetic sensor according to claim 12, wherein the plurality of magnetoresistive elements are arranged in a lattice pattern when seen in one direction orthogonal to each of the first reference direction and the second reference direction.

* * * * *